US008412506B2

(12) United States Patent
Yamagajo

(10) Patent No.: US 8,412,506 B2
(45) Date of Patent: Apr. 2, 2013

(54) ELECTROMAGNETIC FIELD SIMULATION APPARATUS AND COMPUTER READABLE STORAGE MEDIUM STORING ELECTROMAGNETIC FIELD SIMULATION PROGRAM

(75) Inventor: Takashi Yamagajo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 253 days.

(21) Appl. No.: 12/707,786

(22) Filed: Feb. 18, 2010

(65) Prior Publication Data

US 2010/0223043 A1    Sep. 2, 2010

(30) Foreign Application Priority Data

Mar. 2, 2009    (JP) .................................. 2009-48523

(51) Int. Cl.
*G06G 7/62*    (2006.01)
(52) U.S. Cl. ........................................................ 703/13
(58) Field of Classification Search .................. None
See application file for complete search history.

(56) References Cited

U.S. PATENT DOCUMENTS

| | | | |
|---|---|---|---|
| 2005/0246669 | A1 | 11/2005 | Yamazaki |
| 2006/0095493 | A1 | 5/2006 | Kumano et al. |
| 2006/0173662 | A1 | 8/2006 | Kazama et al. |
| 2006/0217909 | A1 | 9/2006 | Uriu et al. |

FOREIGN PATENT DOCUMENTS

| | | |
|---|---|---|
| JP | 09-223166 | 8/1997 |
| JP | 2004-004054 | 1/2004 |
| JP | 2005-316754 | 11/2005 |
| JP | 2006-209590 | 8/2006 |
| JP | 2006-303202 | 11/2006 |
| JP | 2006-313522 | 11/2006 |
| JP | 2007-249642 | 9/2007 |
| JP | 2007-304952 | 11/2007 |
| JP | 2008-157746 | 7/2008 |
| JP | 2008-257302 | 10/2008 |
| WO | 2005/015449 | 2/2005 |

OTHER PUBLICATIONS

Kung et al. "A Finite-Difference Time-Domain (FDTD) Software for Simulation of Printed Circuit Board (PCB) Assembly", Progress in Electromagnetics Research, PIER 50, 2005, pp. 299-335.*

Benkler et al. "Mastering Conformal MEshing for Complex CAD-Based C-FDTD Simulations", IEEE Antennas and Propagation Magazine, vol. 50, No. 2, Apr. 2008, pp. 45-57.*

(Continued)

*Primary Examiner* — Suzanne Lo
(74) *Attorney, Agent, or Firm* — Katten Muchin Rosenman LLP

(57) ABSTRACT

A computer readable storage medium storing an electromagnetic field simulation program that causes a computer to execute receiving data defining, in virtual space, a shape of a conductor and an insulator included in a conductive layer and a dielectric layer of a printed circuit board; setting a plurality of cells in the virtual space by arranging nodes of the cells on a boundary between the conductive layer and the dielectric layer in a thickness direction of the printed circuit board and by arranging nodes of the cells at regular intervals in a plane parallel to the printed circuit board; giving, to each of the cells, an electric constant of a medium occupying an area of each of the cells; and determining a change over time in a an electromagnetic field strength in each of the cells.

10 Claims, 25 Drawing Sheets

OTHER PUBLICATIONS

Okoniewski et al. "Three-Dimensional Subgridding Algorithm for FDTD", IEEE Transactions on Antennas and PRopagation, vol. 45, No. 3, Mar. 1997, pp. 422-429.*

Dey et al. "A Locally Conformal Finite-Difference Time-Domain (FDTD) Algorithm for Modeling Three-Dimensional PErfectly Conducting Objects", IEEE Microwave and Guided Wave Letters, vol. 7, No. 9, Sep. 1997, pp. 273-275.*

Hill, J. "Efficient Implementation of Mesh Generation and FDTD Simulation of Electromagnetic Fields", Thesis, Aug. 1996, 324 pages.*

European Search Report and Annex to the European Search Report dated May 4, 2010 for corresponding European Patent Application No. EP 10 15 4567.

An Ping Zhao, et al., "An Efficient FDTD Algorithm for the Analysis of Microstrip Patch Antennas Printed on a General Anisotropic Dielectric Substrate", IEEE Transactions on Microwave Theory and Techniques, Jul. 1, 1999, pp. 1142-1146, vol. 47, Issue No. 7, IEEE Service Center, Piscataway, NJ, US.

Wenhua Yu, et al., "A Conformal FDTD Software Package Modeling Antennas and Microstrip Circuit Components", IEEE Antennas and Propagation Magazine, Oct. 1, 2000, pp. 28-39, vol. 42, No. 5, IEEE Service Center, Piscataway, NJ US.

Mingwu Yang, et al., "Automesh an Automatically Adjustable, Non Uniform, Orthogonal FDTD Mesh Generator", IEEE Antennas and Propagation Magazine, Apr. 1, 1999, pp. 13-19, vol. 41, No. 2, IEEE Service Center, Piscataway, NJ.

W.Yu, et al., "Application of FDTD Method to Conformal Patch Antennas", IEE Proceedings H. Microwaves, Antennas & Propagation, Institution of Electrical Engineers, Jun. 11, 2001, pp. 218-220, vol. 148, No. 3.

Notice of Reason for Refusal dated Nov. 20, 2012, from corresponding Japanese Application No. 2009-048523 with partial translation.

* cited by examiner

FIG. 9
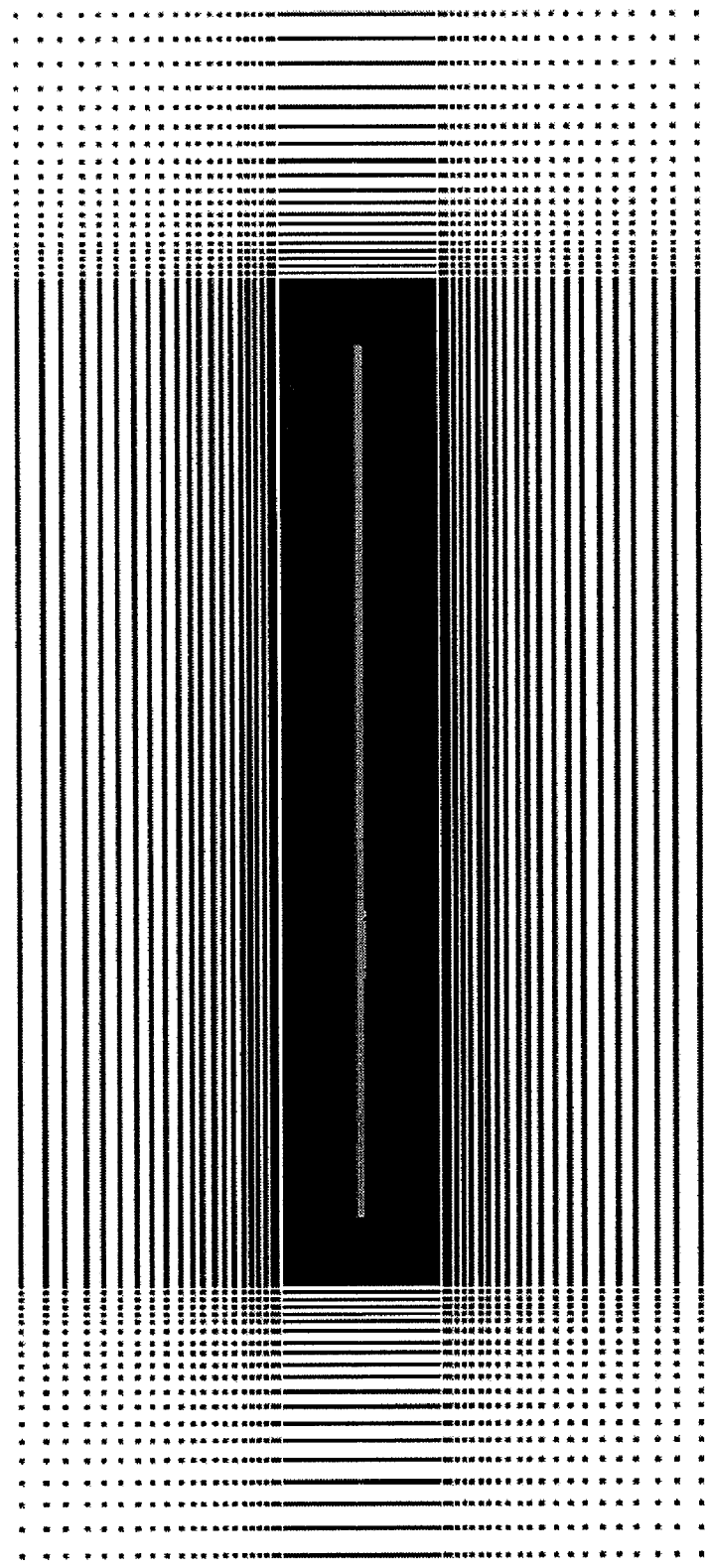
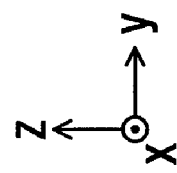

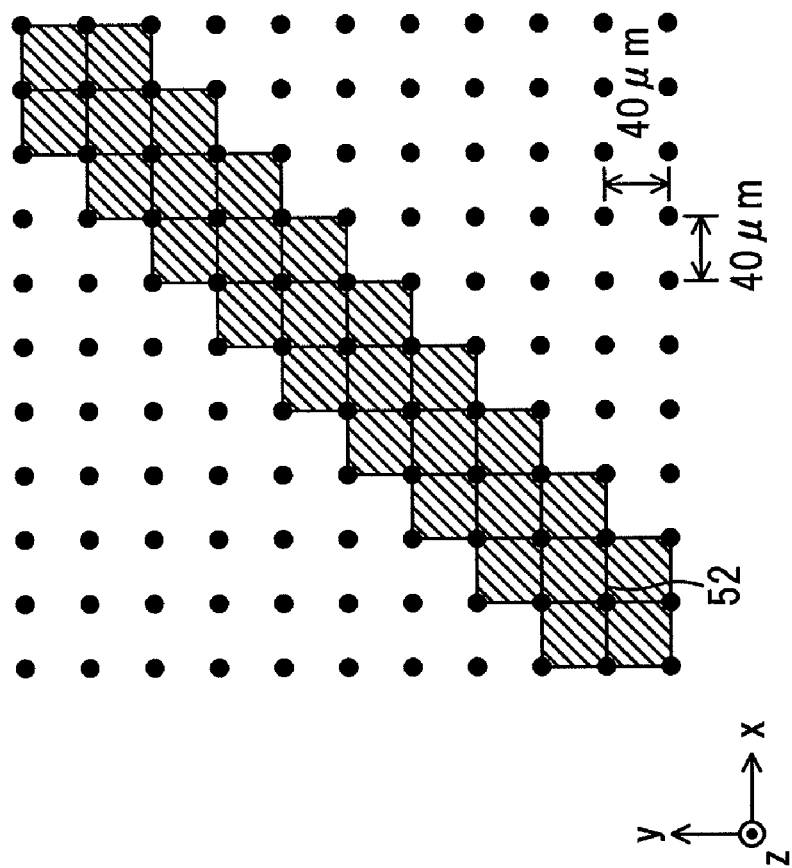
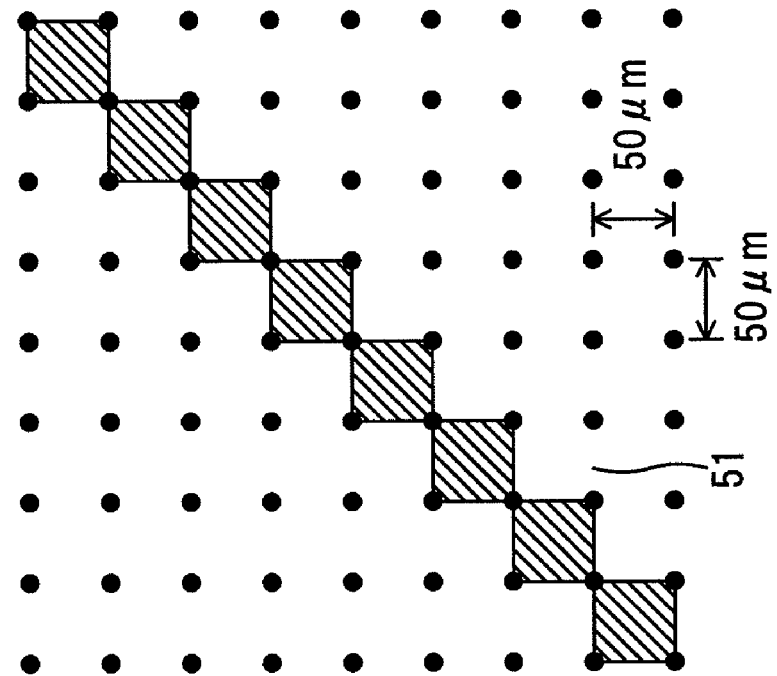

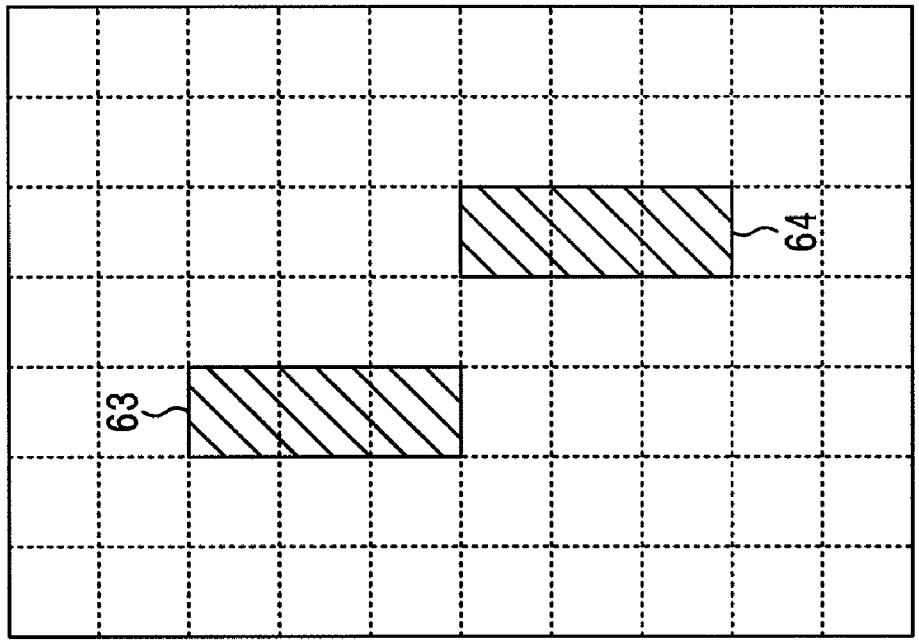
FIG. 12B
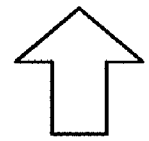
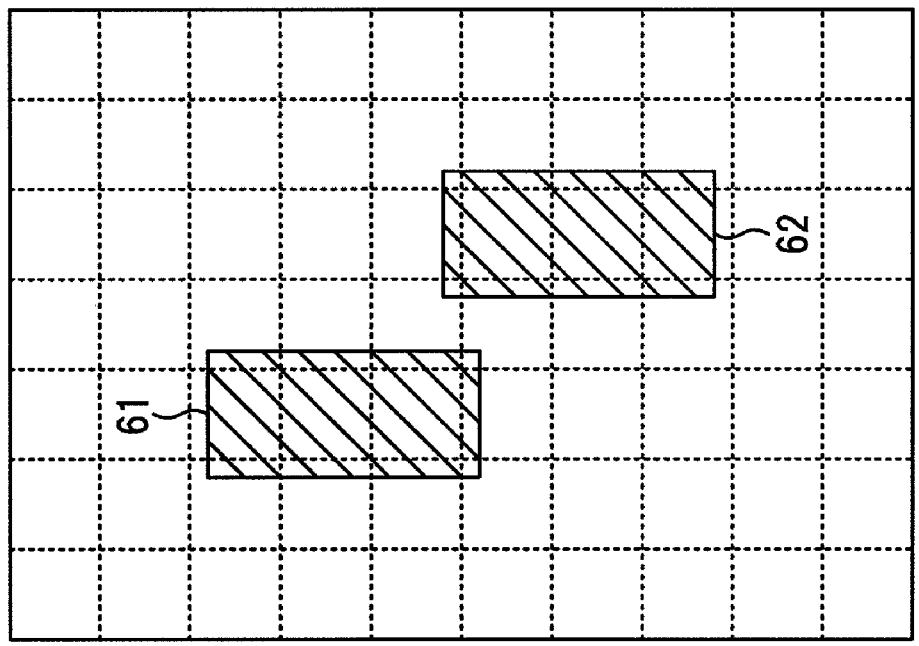
FIG. 12A

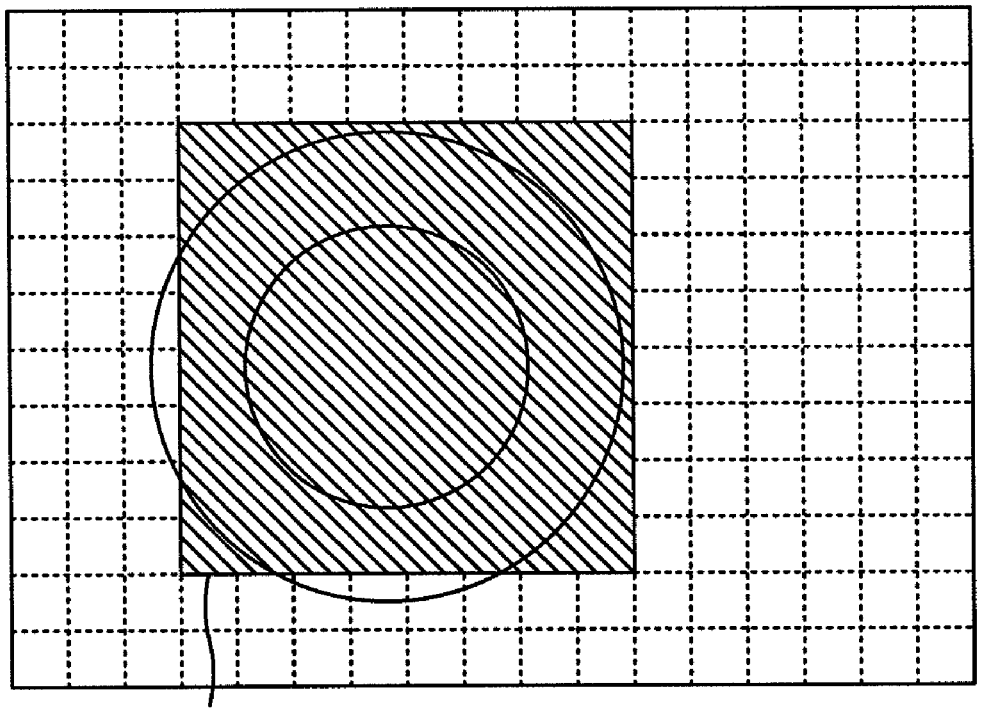
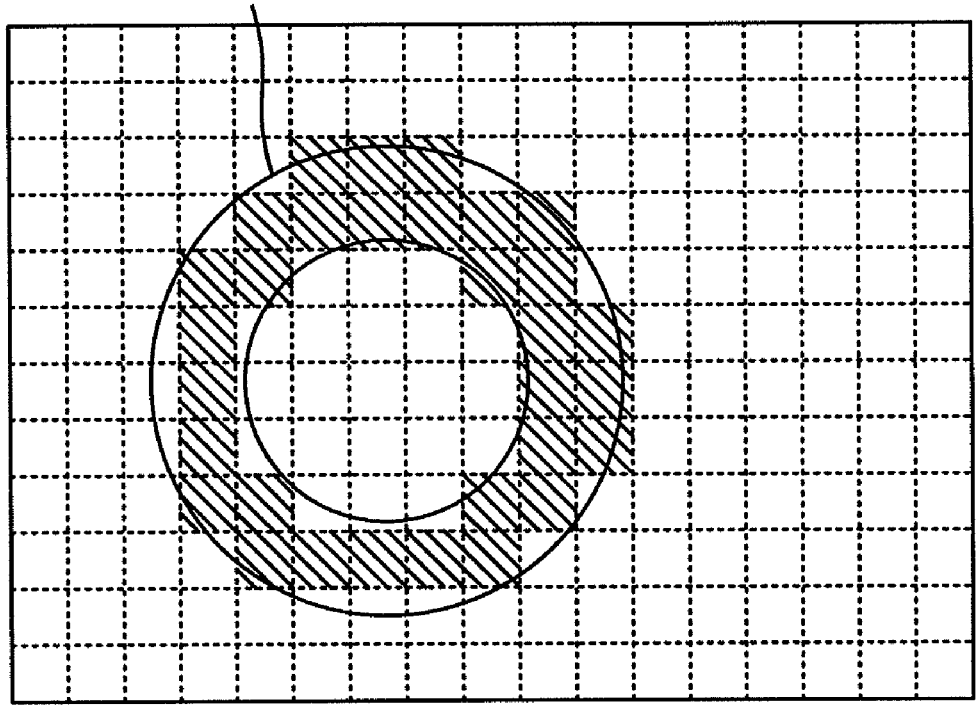
FIG. 13B
FIG. 13A

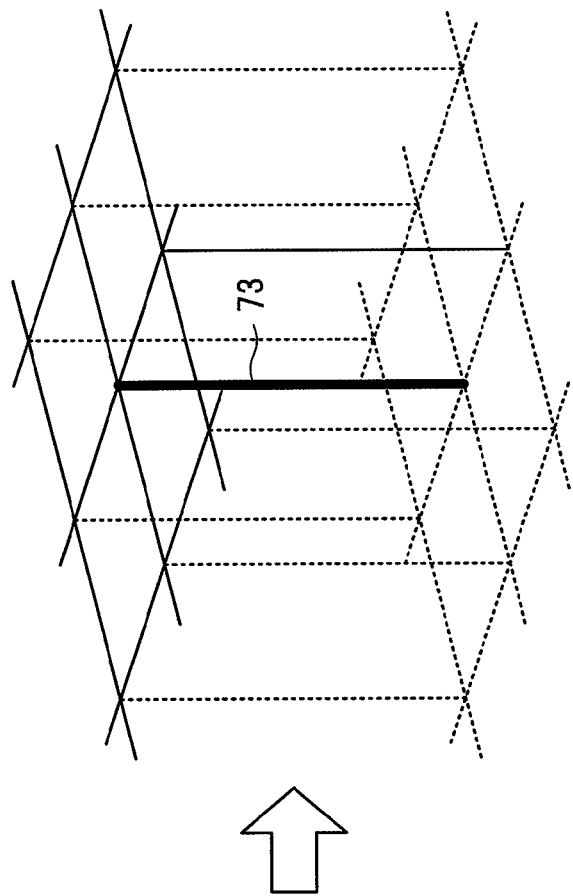
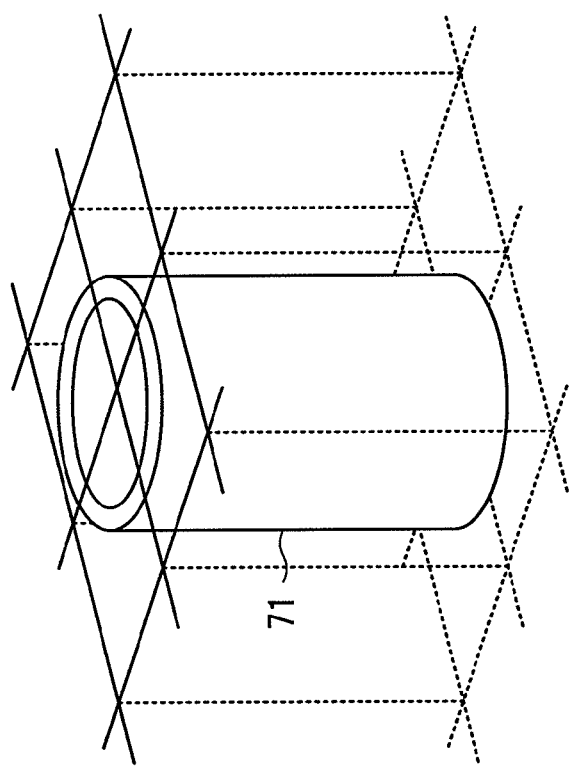

MODEL 1
0.102mm
0.150mm

MODEL 2
0.102mm
0.150mm

MODEL 3
0.102mm
0.150mm

MODEL 4
0.150mm

MODEL 5
0.126mm

MODEL 6
0.102mm

MODEL 7
0.050mm

ELECTROMAGNETIC FIELD SIMULATION APPARATUS AND COMPUTER READABLE STORAGE MEDIUM STORING ELECTROMAGNETIC FIELD SIMULATION PROGRAM

CROSS-REFERENCE TO RELATED APPLICATION

This application is based upon and claims the benefit of priority of the prior Japanese Patent Application No. 2009-48523, filed on Mar. 2, 2009, the entire contents of which are incorporated herein by reference.

FIELD

Embodiments of the present invention relate to electromagnetic-field computer simulation.

BACKGROUND

As is known, computer simulation refers to representing a certain event on a computer in a simulated manner. The expression "representation of an event" as used herein refers to visually or statistically expressing changes over time in the state of existing or unknown matter that causes the event. The computer simulation uses a mathematical model that represents an event in an abstract form. The mathematical model is a collection of elements correlated by predetermined mathematical expressions. The computer simulation is performed with a simulation program, such as simulation software or a simulator, executed by a computer.

An electromagnetic field simulator represents, on a computer, a state of electromagnetic fields in a space inside or outside a physical object, such as a printed circuit board, a wireless communication circuit, a high-frequency circuit, an antenna, a radar device, a radio-wave absorber, a power system, or photonic crystal. Specifically, the state of electromagnetic fields is represented by determining the strengths of electromagnetic fields in a mathematical model, i.e., in individual elements, each time a time-step is increased by one in a given time span and then performing processing for displaying animation and so on based on the determined strengths. The strengths of the electric fields of the elements are determined using Maxwell's equations. As the number of elements increases, a larger amount of time is required to determine the strengths of the electromagnetic fields.

One example of the electromagnetic field simulator is an FDTD (finite-difference time-domain) simulator. The FDTD simulator employs an FDTD method to represent, on a computer, the state of an electromagnetic field in space inside or outside of a physical object as described above. The "FDTD method" as used herein refers to a method in which points at which electric field strengths are to be calculated and points at which magnetic field strengths are to be calculated are discretely placed in virtual space (analysis space) in which the shape of a physical object is defined and the electric field strengths and the magnetic field strengths are alternately calculated along a time axis. Hereinafter, the points at which electric field strengths are calculated are referred to as "electric-field calculation points" and the points at which magnetic field strengths are calculated are referred to as "magnetic-field calculation points".

More specifically, in the FDTD method, multiple rectangular-parallelepiped cells are set in virtual space. Each cell is given a medium-dependent electric constant of a medium (an object or air) occupying a large area of the cell. Examples of the electric constant include an electric permittivity, a magnetic permeability, and an electrical conductivity. The electric-field calculation points are arranged at the centers of the edges of each cell and the magnetic-field calculation points are arranged at the centers of the faces of each cell. In such a manner, in the FDTD method, the electric-field calculation points and the magnetic-field calculation points are discretely placed. Placing the electric-field calculation points and the magnetic-field calculation points in virtual space is referred to as "spatial discretization".

In the FDTD method, when the position of a wave source, the magnitude of the wave source, and the time-step size are specified, electric field strengths at the electric-field calculation points and magnetic field strengths at the magnetic-field calculation points are repeatedly determined in a given time span. More specifically, the electric-field strength at one electric-field calculation point is determined based on an electric-field strength determined one time step earlier at the same electric-field calculation point and magnetic-field strengths determined a half time step earlier at the magnetic-field calculation points adjacent to the electric-field calculation point. Similarly, the magnetic-field strength at one magnetic-field calculation point is determined based on a magnetic-field strength determined one time step earlier at the same magnetic-field calculation point and electric field strengths determined a half time step earlier at the electric-field calculation points adjacent to the magnetic-field calculation point. The method for alternately determining the electric field strengths and the magnetic field strengths every half time step is called the "leapfrog algorithm".

A multilayer printed circuit board has conductive layers and dielectric layers. Each conductive layer includes conductors and insulators at which a two-dimensional circuit pattern is formed. Each dielectric layer includes an insulator. In the multilayer printed circuit board, the conductive layers and the dielectric layers are alternately provided in the thickness direction. The dielectric layer further includes vias, which are conductors for interconnecting the conductors in particular conductive layers or interconnecting the conductors in all conductive layers. The above-described FDTD simulator is also used to design such a type of multiplayer printed circuit board. The multilayer printed circuit board has a larger number of conductive layers than a single-layer printed circuit board. Thus, for discretization of virtual space in which the shape of a multilayer printed circuit board is defined, the FDTD simulator sets a vast number of cells, compared to the single-layer printed circuit board.

The existing FDTD simulator sets cells so that edges of each circuit wire and edges of the cells agree with each other in a plane parallel to the printed circuit board. Thus, the contour shape of each wire is precisely traced by edges of the cells. For example, as illustrated in FIG. 25, there is a case in which two rectangular circuit wires 61 and 62 that are parallel to each other are arranged so that they are spaced apart from each other in their lateral direction and overlap each other slightly in their longitudinal direction. In this case, by setting narrow cells having the width of the overlapping portion, the existing FDTD simulator allows the same electric constant as that of the two circuit wires 61 and 62 to be given to cell groups 66 and 67 having the same shape and the same size as the two wires 61 and 62.

That is, the existing FDTD simulator is adapted to set narrow cells in order to achieve the tracing described above. This arrangement, however, has a problem. Specifically, when the density of the circuit pattern increases, the number of cells increases and the amount of time for computing the electromagnetic-field strengths increases.

As defined by the so-called "Courant-Friedrichs-Lewy condition", the upper limit of the time-step size is proportional to a minimum cell size. Thus, when narrow cells are set for the tracing described above, the time-step size also needs to be reduced. This leads to an increase in the number of time steps, and thus there is a problem in that the amount of time for computing the electromagnetic-field strengths increases.

In addition, during determination of the positions of the edges of the cells, the existing FDTD simulator performs processing for detecting edges of circuit wires. Thus, when the circuit pattern has a high density, a large amount of time is required for processing for spatial discretization.

SUMMARY

According to an aspect of the embodiments discussed herein, a computer readable storage medium stores an electromagnetic field simulation program that causes a computer to execute a receiving process of receiving data defining, in virtual space, a shape of a conductor and a shape of an insulator included in a conductive layer and a dielectric layer of a printed circuit board; a setting process of setting a plurality of cells in the virtual space by arranging nodes of the cells on a boundary between the conductive layer and the dielectric layer in a thickness direction of the printed circuit board, and by arranging nodes of the cells at regular intervals in a plane parallel to the printed circuit board; a giving process of giving, to each of the cells, an electric constant of a medium occupying an area of each of the cells; and a determining process of determining a change over time in an electromagnetic field strength in each of the cells.

It is to be understood that both the foregoing general description and the following detailed description are exemplary and explanatory and are not restrictive of the embodiments, as claimed.

BRIEF DESCRIPTION OF DRAWINGS

FIG. 9 is a view illustrating an example of a state in which the nodes of the cells are arranged in virtual space in which the shape of the multilayer printed circuit board is defined, the state being viewed in the direction perpendicular to the thickness direction;

FIG. 10A illustrates a state in which a circuit wire having a conducting-line width of 60 µm is modeled on cells, each having dimensions of 50 µm×50 µm, and FIG. 10B illustrates a state in which a circular wire having a conducting-line wide of 60 µm is modeled on cells, each having dimensions of 40 µm×40 µm;

FIG. 12A illustrates a relationship between a circuit pattern defined in virtual space and cells set by the FDTD simulator according to the embodiment, and FIG. 12B illustrates cells to which an electric constant of circuit wires is given;

FIG. 13A illustrates a via and cells to which an electric constant of the via is given and FIG. 13B illustrates cells to which the electric constant of the via is given after the domain to which the electric constant of the via is given are adjusted to have a rectangular columnar shape;

FIG. 14A illustrates a relationship between a via and cells and FIG. 14B illustrates a relationship between a via approximated to have a wire shape and cells;

DESCRIPTION OF EMBODIMENTS

Configuration

Figure 1:
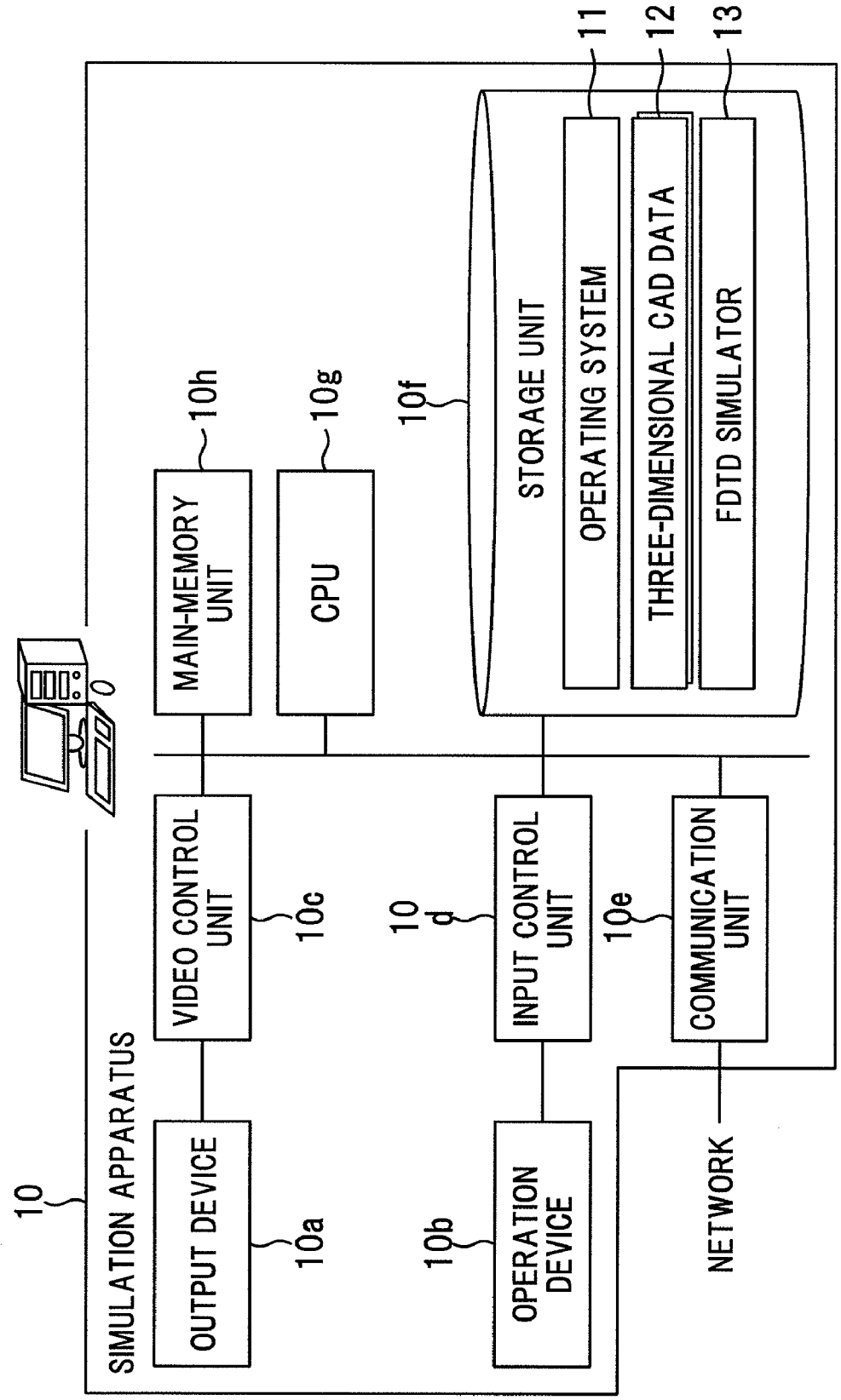
FIG. 1 is a diagram illustrating the configuration of a simulation apparatus according to an embodiment.

FIG. 1 is a diagram illustrating a configuration of a simulation apparatus 10 according to an embodiment.

The simulation apparatus 10 may be a personal computer (PC) into which an FDTD (finite-difference time-domain) simulator 13, which is described below, is incorporated. The simulation apparatus 10 includes an output device 10a, an operation device 10b, and a main unit to which the devices 10a and 10b are coupled. Examples of the output device 10a include a liquid crystal display with a speaker. Examples of the operation device 10b include a keyboard and a mouse. The main unit has therein a video control unit 10c, an input control unit 10d, a communication unit 10e, a storage unit 10f, a CPU (central processing unit) 10g, and a main-memory unit 10h.

The video control unit 10c generates an audio/video signal based on audio information and image information sent from the CPU 10g and outputs the generated audio/video signal to the output device 10a. The output device 10a outputs audio/video based on the audio/video signal input from the video control unit 10c.

The input control unit 10d detects an operation performed on the operation device 10b and notifies the CPU 10g that the operation was performed and what type of operation was performed.

The communication unit 10e performs wired or wireless communication with a relay device in a network. Examples of the communication unit 10e include an Ethernet (a trademark of Xerox Corporation, USA), an FC (fiber channel) card, an ATM (asynchronous transfer mode) card, a token ring card, an FDDI (fiber distributed data interface) card, a wireless LAN (local area network) card, a Bluetooth (a trademark of Bluetooth Special Interest Group) card, a data communication card, and a modem. The communication unit 10e may be a type of communication unit that is externally connected to the main unit of the simulation apparatus 10 via a PC card slot, a PCI (peripheral component interconnect) card slot, a USB (universal serial bus) slot, a SCSI (small computer system interface) slot, an AGP (accelerated graphics port) slot, a CF (CompactFlash) card slot, or an SD (secure digital) card slot. Examples of the relay device include a switching hub, a router, an FC switch, an FDDI switch, an ATM switch, a wireless hub, a wireless LAN router, a mobile-phone repeater (a line compensator), a radio waveform repeater for a PHS (personal handyphone system), and a TA (terminal adapter).

The storage unit 10f has a storage medium to which various programs and various types of data are recorded. The storage unit 10f writes and reads data to and from the storage medium in accordance with an instruction from the CPU 10g. Examples of the storage unit 10f include an SSD (solid state drive) device, a HDD (hard disk drive) device, a BD (Blu-ray Disc) drive device, a DVD (digital versatile disk) drive device, a +R/+RW disc drive device, a CD (compact disk) drive device, a memory-card drive device, and a flexible disk drive device. Examples of the storage medium include a non-volatile semiconductor memory (a flash memory), a hard disk, a BD, a DVD, a +R/+RW disc, a CD, a memory card, and a flexible disk. Variations of the BD include a BD-R, BD-RE (rewritable), and BD-ROM (read only memory). Variations of the DVD include DVD-R (recordable), DVD-RW (rewritable), DVD-ROM, and DVD-RAM (random access memory). Variations of the CD include CD-R, CD-RW, and CD-ROM. Examples of the memory card include a CompactFlash (a trademark of SanDisk Corporation, USA), SmartMedia (a trademark of Toshiba Corporation) card, SD card (a trademark of SanDisk Corporation, Panasonic Corporation, and Toshiba Corporation), Memory Stick (a trademark of Sony Corporation), and MMC (a trademark of Siemens Corporation and SanDisk Corporation). The storage medium exemplified above may be removably loaded into the drive device or may be fixedly installed in the drive device. In either case, the storage medium exemplified above is computer readable.

The CPU 10g performs processing in accordance with a program in the storage unit 10f. The CPU 10g caches a program and/or data into the main-memory unit 10h or loads a work area in the main-memory unit 10h. Examples of the main-memory unit 10h include a DRAM (dynamic random access memory) and an SRAM (static random access memory).

An operating system 11, three-dimensional CAD (computer-aided design) data 12, and the FDTD simulator 13 are recorded in the data storage unit 10f in the simulation apparatus 10.

Programs, such as software, applications, modules, and components may hereinafter be referred to with the names of their functions realized by the programs executed by the CPU 10g.

The operating system 11 mainly mediates between software and hardware and manages memory space, files, processes, tasks, and so on. In the present embodiment, the operating system 11 includes a driver for the communication unit 10e and a communication interface. The communication interface performs data exchange with a communication interface of another computer on the network. One example of the communication interface is a TCP/IP (transmission control protocol/internet protocol) suite.

The three-dimensional CAD data 12 and the FDTD simulator 13, which are described below, may be downloaded to the storage medium in the storage unit 10f from another computer on the network via the communication interface, the driver, and the communication unit 10e. The three-dimensional CAD data 12 and the FDTD simulator 13, which are described below, may be stored on the above-exemplified storage medium by another computer and then incorporated into the simulation apparatus 10 through loading of the storage medium into the drive device. The three-dimensional CAD data 12 and the FDTD simulator 13, which are described below, may be stored on the above-exemplified storage medium by another computer and then copied from the drive device, into which the program-storing storage medium is loaded, to the storage medium in the storage unit 10f.

The three-dimensional CAD data 12 includes vector data and attribute data. The vector data is data for defining, in a virtual space, three-dimensional shapes of one or more components included in, for example, an industrial product. The attribute data indicates material of each component. In the present embodiment, the vector data in the three-dimensional CAD data 12 provides data that specifies line-segment elements and face elements for defining, in the virtual space, contour shapes of conductors and dielectrics contained in a multilayer printed circuit board. One example of the line-segment elements is a combination of the coordinates of two end points in a three-dimensional coordinate system (an xyz Cartesian coordinate system) defined in virtual space. One example of the face elements is a combination of the coordinates of three or more vertices in a three-dimensional coordinate system defined in virtual space. In the present embodiment, the attribute data in the three-dimensional CAD data 12 includes at least an electric permittivity, a magnetic permeability, and an electrical conductivity of a conductor, a dielectric, and air. The multilayer printed circuit board has conductive layers and dielectric layers. Each conductive layer includes conductors and insulators formed in a two-dimensional circuit pattern, and serves as a power layer, a ground layer, or a signal layer. Each dielectric layer includes an insulator. In the multilayer printed circuit board, the conductive layers and the dielectric layers are alternately provided in the thickness direction. The dielectric layers further include vias, which are conductors for interconnecting conductors in particular conductive layers or interconnecting conductors in all conductive layers. In the present embodiment, the three-dimensional CAD data 12 may be created using a CAD application in another computer or may be created using a CAD application (not illustrated) provided as a linking tool provided in the FDTD simulator 13, described below.

The FDTD simulator 13 is software for providing a personal computer with a function for performing FDTD simulation. The FDTD simulator 13 in the present embodiment uses an FDTD method (described below) to represent, on the computer, a state of an electromagnetic field in space inside or outside the multilayer printed circuit board. More specifically, the FDTD simulator 13 represents a state of an electrical signal flowing through conductors in the multilayer printed circuit board or a state of electromagnetic waves radiated from the multilayer printed circuit board into the space surrounding the multilayer printed circuit board. The radiation of the electromagnetic waves into the surrounding space is induced by, for example, a slit formed in the power layer or the ground layer, plane resonance between the power layer and the ground layer, and/or the circuit pattern of the conductive layer. For example, when an operator of the operation device 10b directly gives an instruction for starting the FDTD simulator 13, the CPU 10g starts the FDTD simulator 13 in response to the instruction. Details of processing that the CPU 10g executes in accordance with the FDTD simulator 13 are described below with reference to FIGS. 3 to 14.

FDTD Method

An FDTD method will now be described before a description is given of details of processing performed by the FDTD simulator 13.

The FDTD method refers to a scheme in which points at which electric field strengths are to be calculated and points at which magnetic field strengths are to be calculated are discretely placed in virtual space (analysis space) in which the shape of a physical object is defined and the electric field strengths and the magnetic field strengths are alternately determined along a time axis. The electric field strengths and the magnetic field strengths are determined using Maxwell's equations.

<Extension of Maxwell's Equations>

Maxwell's equations are basic equations used to theoretically explain electromagnetic phenomena. Maxwell's equations in matter include equations (1) to (4):

$$\nabla \times B + \frac{\partial B}{\partial t} = 0 \quad (1)$$

$$\nabla \times H - \frac{\partial D}{\partial t} = J \quad (2)$$

$$\nabla \cdot D = \rho \quad (3)$$

$$\nabla \cdot B = 0 \quad (4)$$

Equation (1) represents Faraday's law (law of electromagnetic induction). Equation (2) represents the extended Ampere's law. Equation (3) represents Gauss's law for an electric field. Equation (4) represents Gauss's law for a magnetic field. The symbol "B" in bold and italics represents a magnetic flux density at time t at position (x, y, z), and the unit of measure is Weber per square meter (Wb/m²). The symbol "H" in bold and italics represents a magnetic field strength at time t at position (x, y, z), and the unit of measure is amperes per meter (A/m). The symbol "D" in bold and italics represents an electric flux density at time t at position (x, y, z), and the unit of measure is coulombs per square meter (C/m²). The symbol "J" in bold and italics represents a current density at time t at position (x, y, z), and the unit of measure is amperes per square meter (A/m²). The symbol "p" represents a charge density at position (x, y, z) and the unit of measure is coulombs per cubic meter (C/m³).

Maxwell's equations use supplementary equations (5) to (7):

$$D = \in E \quad (5)$$

$$B = \mu H \quad (6)$$

$$J = \sigma E \quad (7)$$

Equation (5) is a constitutive equation that relates the electric flux density D to an electric-field strength E when the medium is isotropic and non-dispersive. Equation (6) is a constitutive equation that relates the magnetic flux density B to the magnetic field strength H when the medium is isotropic and non-dispersive. Equation (7) represents Ohm's law. The symbol "E" in bold and italics represents an electric field strength at time t at position (x, y, z), and the unit of measure is volt per meter (V/m). The symbol "∈" represents an electric permittivity of material at position (x, y, z) and the unit of measure is farads per meter (F/m). The symbol "μ" represents a magnetic permeability of material at position (x, y, z) and the unit of measure is Henrys per meter (H/m). The symbol "σ" represents an electrical conductivity of material at position (x, y, z) and the unit of measure is Siemens per meter (S/m).

To derive the electric field strength E and the magnetic field strength H, equations (3) to (7) are used to transform equations (1) and (2) into equations including the electric field strength E and the magnetic field strength H, as equations (8) and (9):

$$\frac{\partial H}{\partial t} = -\frac{1}{\mu} \nabla \times E \quad (8)$$

$$\frac{\partial E}{\partial t} = -\frac{\sigma}{\varepsilon} E + \frac{1}{\varepsilon} \nabla \times H \quad (9)$$

In equations (8) and (9), the electric field strength E and the magnetic field strength H are functions where the position (x, y, z) and the time t are variables. In contrast, the electric permittivity "∈", the magnetic permeability "μ", and the electrical conductivity "σ" are functions where the position (x, y, z) is a variable, as described above. Therefore, the electric field strength E and the magnetic field strength H at the position (x, y, z) are essentially determined by solving simultaneous equations (8) and (9) at given time t.

<Temporal Discretization>

In the FDTD method, simultaneous equations (8) and (9) at time t are solved using a central difference method. The "difference method" as used herein refers to a method for deriving an approximate solution by replacing derivatives at discrete points, placed on a variable axis, in a differentiable function with difference equations and solving the difference equations. The difference equation refers to an equation in which a difference f(q+r)−f(q), which is a value taken by a differentiable function f(q) with respect to two variable values q and q+r, is divided by the difference r between the variable values. The central difference method is a method in which the solution of the function f(q) at the discrete point q is derived by obtaining a difference between a function f(q+r/2) at a middle point q+r/2, located between the discrete point q and a next discrete point, and a function f(q−r/2) at a middle point q−r/2, located between a previous discrete point and the discrete point q.

It is now assumed that time is discretized at discrete points at intervals of Δt (second) on a time axis, where Δt indicates a time step size (a time interval). That is, times t at discrete points on a time axis are assumed to be 0, Δt, 2Δt, . . . , (n−1)Δt, nΔt, (n+1)Δt, . . . , and so on. In this case, the electric field strength E and the magnetic field strength H for time t=nΔt are denoted by En and Hn, respectively. The left hand side of equation (8) for time t=nΔt, i.e., the time derivative at the magnetic field strength Hn, is replaced with a difference equation based on the central difference method to thereby yield:

$$\frac{H^{n+\frac{1}{2}} - H^{n-\frac{1}{2}}}{\Delta t} = -\frac{1}{\mu} \nabla \times E^n \quad (10)$$

Considering that the calculation time of the magnetic field strength H in equation (10) is offset by a half time step relative to the calculation time of the electric field strength E, the left hand side of equation (9) for time t=(n−½)Δt, i.e., the time derivative of the electric field strength En−½, is replaced with a difference equation to thereby yield:

$$\frac{E^n - E^{n-1}}{\Delta t} = -\frac{\sigma}{\varepsilon} E^{n-\frac{1}{2}} + \frac{1}{\varepsilon} \nabla \times H^{n-\frac{1}{2}} \quad (11)$$

From the relationship between equation (10) and equation (11), an approximate expression given by expression (12) below is used based on the premise that the calculation time for the electric field strength E has no half time step.

$$E^{n-\frac{1}{2}} \approx \frac{E^n - E^{n-1}}{2} \quad (12)$$

Substitution of expression (12) into equation (11) yields:

$$\frac{E^n - E^{n-1}}{\Delta t} = -\frac{\sigma}{\varepsilon} \frac{E^n - E^{n-1}}{2} + \frac{1}{\varepsilon} \nabla \times H^{n-\frac{1}{2}} \quad (13)$$

Equations (10) and (13) are modified respectively as:

$$H^{n+\frac{1}{2}} = H^{n-\frac{1}{2}} - \frac{\Delta t}{\mu} \nabla \times E^n \quad (14)$$

$$E^n = \frac{2\varepsilon - \sigma \Delta t}{2\varepsilon + \sigma \Delta t} E^{n-1} + \frac{2\Delta t}{2\varepsilon + \sigma \Delta t} \nabla \times H^{n-\frac{1}{2}} \quad (15)$$

<Spatial Discretization>

As described above, in the FDTD method, points at which electric field strengths are calculated and points at which magnetic field strengths are calculated are discretely placed in virtual space (analysis space) in which the shape of a physical object is defined. Hereinafter, points at which the electric field strengths are calculated are referred to as "electric-field calculation points" and points at which magnetic field strengths are calculated are referred to as "magnetic-field calculation points". More specifically, in the FDTD method, multiple rectangular-parallelepiped cells are set in virtual space in which the shape of a physical object is defined. Each cell is given a medium-dependent electric constant of a medium (an object or air) occupying a large area of the cell. Examples of the electric constant include an electric permittivity, a magnetic permeability, and an electrical conductivity. The electric-field calculation points are arranged at the centers of the edges of each cell and the magnetic-field calculation points are arranged at the centers of the faces of each cell. That is, in the FDTD method, the cells are set in virtual space and the electric-field calculation points and the magnetic-field calculation points are arranged discretely.

Figure 2:
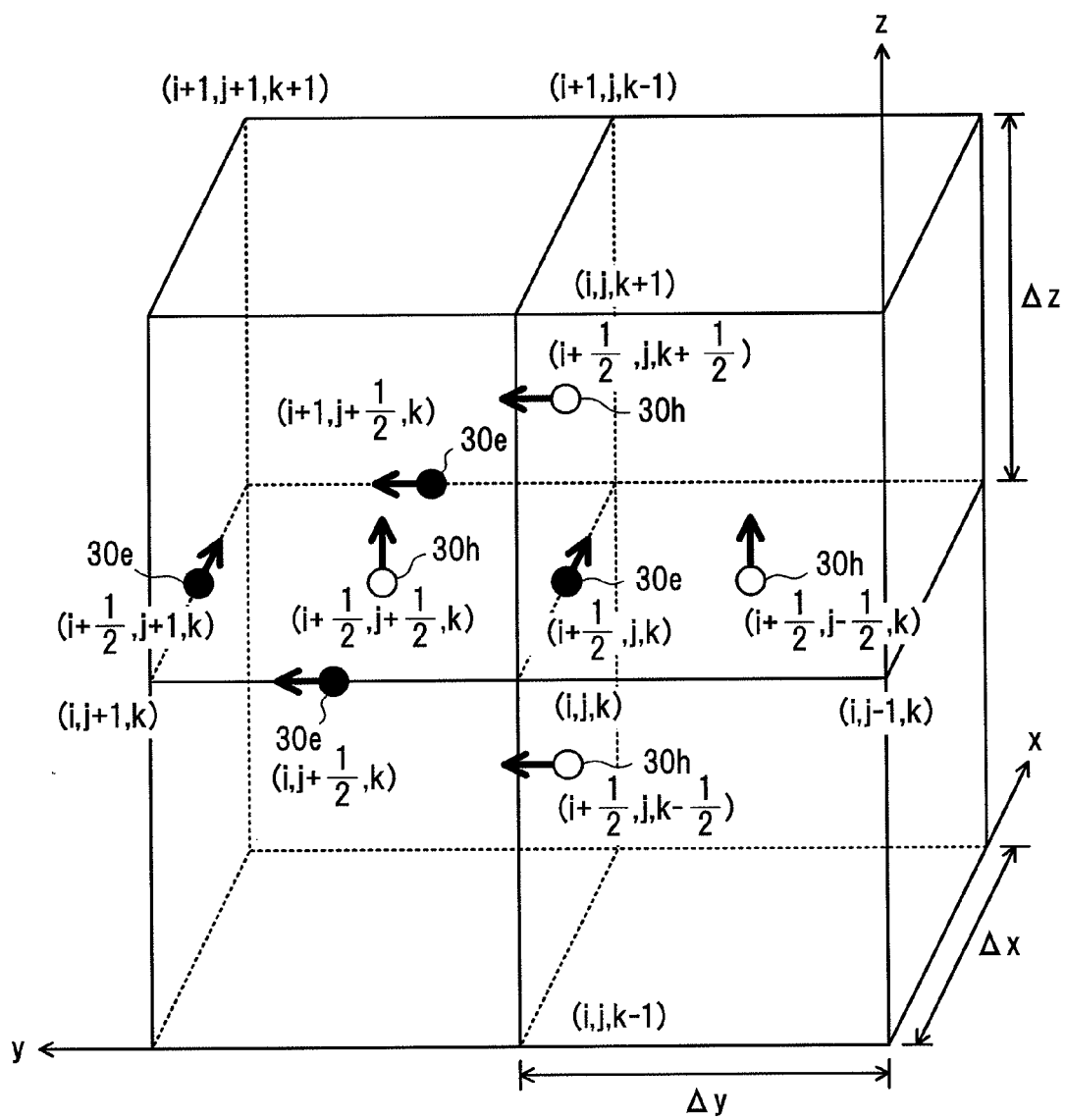
FIG. 2 is a view schematically illustrating relationships among cells, electric-field calculation points, and magnetic-field calculation points in an FDTD method.

FIG. 2 schematically illustrates relationships among cells, electric-field calculation points 30e, and magnetic-field calculation points 30h in the FDTD method.

In FIG. 2, black circles indicate the electric-field calculation points 30e and white circles indicate the magnetic-field calculation points 30h. For ease of understanding, only four electric-field calculation points 30e and four magnetic-field calculation points 30h are illustrated in FIG. 2. As illustrated in FIG. 2, the electric-field calculation points 30e are arranged at the centers of the edges of each cell. The magnetic-field calculation points 30h are arranged at the centers of the faces of each cell. Thus, the magnetic-field calculation points 30h located in closest proximity to one electric-field calculation point 30e are present at the centers of four faces that are in contact with the edge at the center of which the electric-field calculation point 30e is placed. The electric-field calculation points 30e located in closest proximity to one magnetic-field calculation point 30h are present at the centers of four edges of the face at the center of which the magnetic-field calculation point 30h is placed.

The vertices of each cell are herein referred to as "nodes", which are denoted by i, j, and k in the x, y, and z directions respectively from the coordinate origin, where i, j, and k are integers of 0 or greater. Thus, for example, the positions of the magnetic-field calculation points 30h located in closest proximity to the electric-field calculation point 30e located at position (i+½, j, k) are expressed by (i+½, j+½, k), (i+½, j−½, k), (i+½, j, k+½), and (i+½, j, k−½). For example, the positions of the electric-field calculation points 30e located in closest proximity to the magnetic-field calculation point 30h located at position (i+½, j+½, k) are expressed by (i+½, j, k), (i, j+½, k), (i+1, j+½, k), and (i+½, j+1, k).

In this case, the electric-field strength and the magnetic field strength for time t=nΔt at position (i, j, k) are expressed by En (i, j, k) and Hn (i, j, k), respectively. Unit vectors in the x, y, and z directions are respectively denoted by i, j, and k in bold and italics. Further, x, y, and z components of the electric field strength E are denoted by Ex, Ey, and Ez, respectively, and x, y, and z components of the magnetic field strength H are denoted by Hx, Hy, and Hz, respectively. The rotations (rot) of the electric field strength En and the magnetic field strength Hn are expressed as:

$$\nabla \times E^n = \left(\frac{\partial E_z^n}{\partial y} - \frac{\partial E_y^n}{\partial z}\right) i + \left(\frac{\partial E_x^n}{\partial z} - \frac{\partial E_z^n}{\partial x}\right) j + \left(\frac{\partial E_y^n}{\partial x} - \frac{\partial E_x^n}{\partial y}\right) k \quad (16)$$

$$\nabla \times H^n = \left(\frac{\partial H_z^n}{\partial y} - \frac{\partial H_y^n}{\partial z}\right) i + \left(\frac{\partial H_x^n}{\partial z} - \frac{\partial H_z^n}{\partial x}\right) j + \left(\frac{\partial H_y^n}{\partial x} - \frac{\partial H_x^n}{\partial y}\right) k \quad (17)$$

Using equation (16), the z component in equation (14) is given as:

$$H_z^{n+\frac{1}{2}} = H_z^{n-\frac{1}{2}} - \frac{\Delta t}{\mu} \left(\frac{\partial E_y^n}{\partial x} - \frac{\partial E_x^n}{\partial y}\right) \quad (18)$$

The cell dimensions in the x, y, and z directions are denoted by Δx, Δy, and Δz, respectively. For example, equation (18) for the magnetic-field calculation point 30h at position (i+½, j+½, k) is expanded into equation (19) below by replacing the derivatives of the x component and y component of the electric field strength E with difference equations, respectively.

$$H_z^{n+\frac{1}{2}}\left(i+\frac{1}{2}, j+\frac{1}{2}, k\right) = H_z^{n-\frac{1}{2}}\left(i+\frac{1}{2}, j+\frac{1}{2}, k\right) - \quad (19)$$

$$\frac{\Delta t}{\mu}\left(\frac{E_y^n\left(i+\frac{1}{2}, j+1, k\right) - E_y^n\left(i+\frac{1}{2}, j, k\right)}{\Delta x}\right) + \frac{\Delta t}{\mu}\left(\frac{E_x^n\left(i+1, j+\frac{1}{2}, k\right) - E_x^n\left(i, j+\frac{1}{2}, k\right)}{\Delta y}\right)$$

From the relationship between the position (i+½, j+½, k) in FIG. 2 and the positions of four electric-field calculation points 30h that are closest to the magnetic-field calculation points 30e located at the position (i+½, j+½, k), the following is apparent. Equation (19) indicates that the magnetic field strength Hn+½ at the magnetic-field calculation point 30h is determined based on a magnetic strength Hn−½ determined one time step earlier at the magnetic-field calculation point 30h and an electric-field strength En determined a half time step earlier at four electric-field calculation points 30e that are closest to the magnetic-field calculation point 30h. The magnetic permeability "μ" and the cell dimensions Δx, Δy, and Δz in the x, y, and z directions are functions where the position (i, j, k) is a variable.

Through the same discussion as for deriving equation (19), for example, the y component in equation (14) for the magnetic-field calculation point 30h located at the position (i+½, j, k+½) is given as:

$$H_y^{n+\frac{1}{2}}\left(i+\frac{1}{2}, j, k+\frac{1}{2}\right) = H_y^{n-\frac{1}{2}}\left(i+\frac{1}{2}, j, k+\frac{1}{2}\right) - \quad (20)$$

$$\frac{\Delta t}{\mu}\left(\frac{E_x^n\left(i+1, j, k+\frac{1}{2}\right) - E_x^n\left(i, j, k+\frac{1}{2}\right)}{\Delta z}\right) + \frac{\Delta t}{\mu}\left(\frac{E_z^n\left(i+\frac{1}{2}, j, k+1\right) - E_z^n\left(i+\frac{1}{2}, j, k\right)}{\Delta x}\right)$$

For example, the x component in equation (14) for the magnetic-field calculation point 30h located at the position (i, j+½, k+½) is given as:

$$H_x^{n+\frac{1}{2}}\left(i, j+\frac{1}{2}, k+\frac{1}{2}\right) = H_x^{n-\frac{1}{2}}\left(i, j+\frac{1}{2}, k+\frac{1}{2}\right) - \quad (21)$$

$$\frac{\Delta t}{\mu}\left(\frac{E_z^n\left(i, j+\frac{1}{2}, k+1\right) - E_z^n\left(i, j+\frac{1}{2}, k\right)}{\Delta y}\right) + \frac{\Delta t}{\mu}\left(\frac{E_y^n\left(i, j+1, k+\frac{1}{2}\right) - E_y^n\left(i, j, k+\frac{1}{2}\right)}{\Delta z}\right)$$

In the FDTD method, any of three expanded equations (19) to (21) is used to determine the magnetic field strengths H at the magnetic-field calculation points 30h at each time point. As indicated by arrows in FIG. 2, the magnetic-field strength H at one magnetic-field calculation point 30h may be determined by obtaining only the components in the direction normal to the face at the center of which the magnetic-field calculation point 30h is placed.

Using equation (17), the x component in equation (15) is given as:

$$E_x^n = \frac{2\varepsilon - \sigma\Delta t}{2\varepsilon + \sigma\Delta t} E_x^{n-1} + \frac{2\Delta t}{2\varepsilon + \sigma\Delta t}\left(\frac{\partial H_z^{n-\frac{1}{2}}}{\partial y} - \frac{\partial H_y^{n-\frac{1}{2}}}{\partial z}\right) \quad (22)$$

For example, equation (22) for the electric-field calculation point 30e at the position (i+½, j, k) is expanded into equation (23) below by replacing the derivatives of the y component and z component of the magnetic field strength H with difference equations, respectively.

$$E_x^n\left(i+\frac{1}{2}, j, k\right) = \frac{2\varepsilon - \sigma\Delta t}{2\varepsilon + \sigma\Delta t} E_x^{n-1}\left(i+\frac{1}{2}, j, k\right) + \quad (23)$$

$$\frac{2\Delta t}{2\varepsilon + \sigma\Delta t}\left(\frac{H_z^{n-\frac{1}{2}}\left(i+\frac{1}{2}, j, k+\frac{1}{2}\right) - H_z^{n-\frac{1}{2}}\left(i+\frac{1}{2}, j, k-\frac{1}{2}\right)}{\Delta y}\right) -$$

$$\frac{2\Delta t}{2\varepsilon + \sigma\Delta t}\left(\frac{H_y^{n-\frac{1}{2}}\left(i+\frac{1}{2}, j+\frac{1}{2}, k\right) - H_y^{n-\frac{1}{2}}\left(i+\frac{1}{2}, j-\frac{1}{2}, k\right)}{\Delta z}\right)$$

From the relationship between the position (i+½, j, k) in FIG. 2 and the positions of four magnetic-field calculation points 30h that are closest to the electric-field calculation point 30e located at the position (i+½, j, k), the following is apparent. Equation (23) indicates that the electric field strength En at the electric-field calculation point 30e is determined based on an electric strength En−1 determined one time step earlier at the electric-field calculation point 30e and a magnetic-field strength Hn−½ determined a half time step earlier at four magnetic-field calculation points 30h that are closest to the electric-field calculation point 30e. The electric permittivity "∈", the electrical conductivity "σ", and the cell dimensions Δx, Δy, and Δz in the x, y, and z directions are functions where the position (i, j, k) is a variable.

Through the same discussion as for deriving equation (23), for example, the y component in equation (15) for the electric-field calculation point 30e located at the position (i, j+½, k) is given as:

$$E_y^n\left(i, j+\frac{1}{2}, k\right) = \frac{2\varepsilon - \sigma\Delta t}{2\varepsilon + \sigma\Delta t} E_y^{n-1}\left(i, j+\frac{1}{2}, k\right) + \quad (24)$$

$$\frac{2\Delta t}{2\varepsilon + \sigma\Delta t}\left(\frac{H_x^{n-\frac{1}{2}}\left(i+\frac{1}{2}, j+\frac{1}{2}, k\right) - H_x^{n-\frac{1}{2}}\left(i-\frac{1}{2}, j+\frac{1}{2}, k\right)}{\Delta z}\right) -$$

$$\frac{2\Delta t}{2\varepsilon + \sigma\Delta t}\left(\frac{H_z^{n-\frac{1}{2}}\left(i, j+\frac{1}{2}, k+\frac{1}{2}\right) - H_z^{n-\frac{1}{2}}\left(i, j+\frac{1}{2}, k-\frac{1}{2}\right)}{\Delta x}\right)$$

For example, the z component in equation (15) for the electric-field calculation point 30e located at the position (i, j, k+½) is given as:

$$E_z^n\left(i, j, k+\frac{1}{2}\right) = \frac{2\varepsilon - \sigma\Delta t}{2\varepsilon + \sigma\Delta t} E_z^{n-1}\left(i, j, k+\frac{1}{2}\right) + \qquad (25)$$

$$\frac{2\Delta t}{2\varepsilon + \sigma\Delta t} \left( \frac{H_y^{n-\frac{1}{2}}\left(i, j+\frac{1}{2}, k+\frac{1}{2}\right) - H_y^{n-\frac{1}{2}}\left(i, j-\frac{1}{2}, k+\frac{1}{2}\right)}{\Delta x} \right) -$$

$$\frac{2\Delta t}{2\varepsilon + \sigma\Delta t} \left( \frac{H_x^{n-\frac{1}{2}}\left(i+\frac{1}{2}, j, k+\frac{1}{2}\right) - H_x^{n-\frac{1}{2}}\left(i-\frac{1}{2}, j, k+\frac{1}{2}\right)}{\Delta y} \right)$$

In the FDTD method, any of three expanded equations (23) to (25) is used to determine the electric field strengths E at the electric-field calculation points 30e at each time point. As indicated by arrows in FIG. 2, the electric-field strength E at one electric-field calculation point 30e may be determined by obtaining only components in a direction parallel to the edge at the center of which the electric-field calculation point 30e is placed.

Simulation Processing

Figure 3:
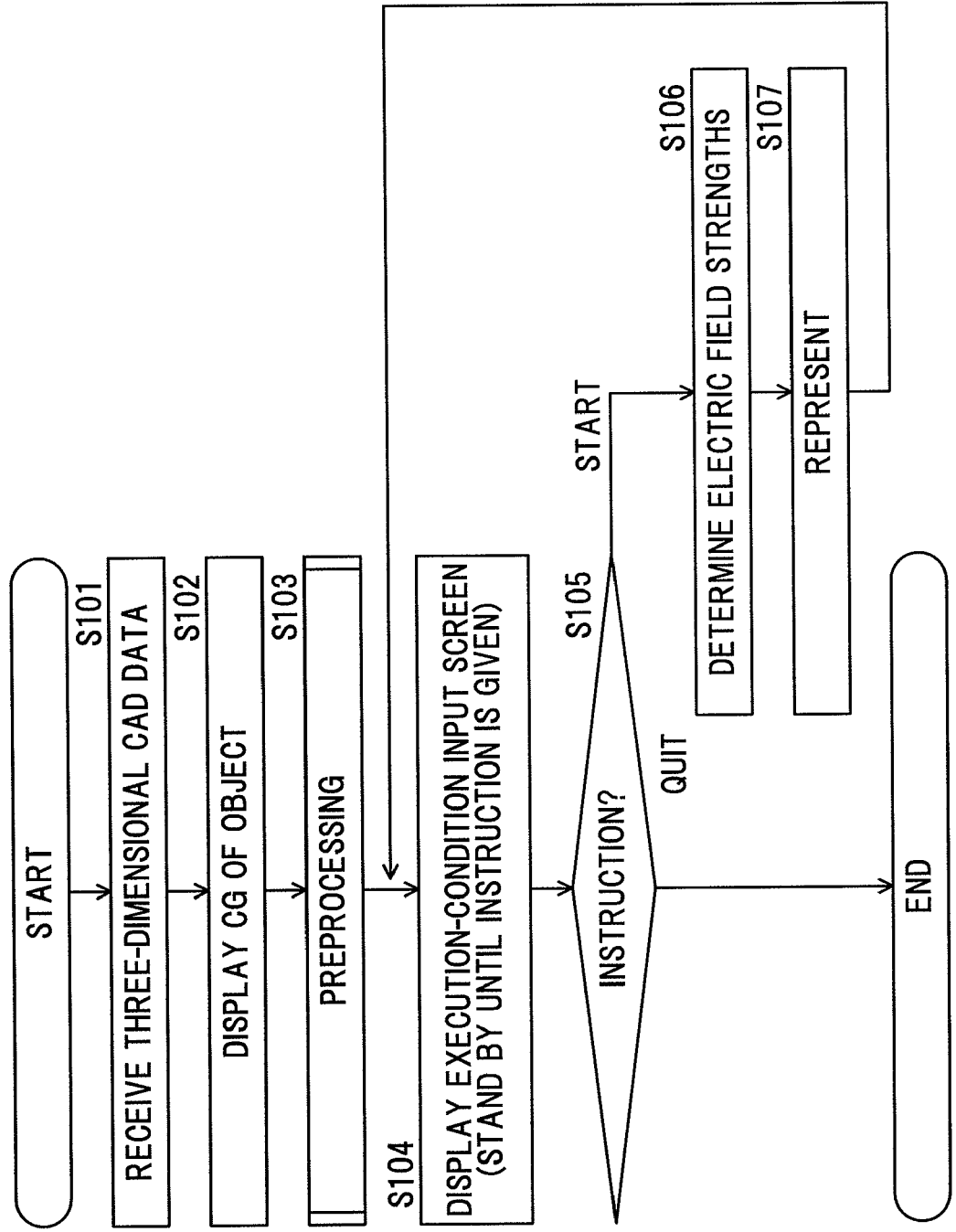
FIG. 3 illustrates a flow of a routine that a CPU executes in accordance with an FDTD simulator.

FIG. 3 illustrates a flow of a routine that the CPU 10g executes in accordance with the FDTD simulator 13.

After the routine is started, in initial step S101, the CPU 10g performs processing for receiving the three-dimensional CAD data 12. More specifically, the CPU 10g performs processing for displaying a file-path input screen (not illustrated) on the output device 10a and stands by until an operator of the operation device 10b clicks an import button included in the file-path input screen. When the operator of the operation device 10b clicks the import button, the CPU 10g obtains a file path that the operator entered in an entry field included in the file-path input screen (not illustrated). The CPU 10g performs processing for reading, from the storage unit 10f, the three-dimensional CAD data 12 located by the obtained file path.

Step S101 is one example of a receiving process.

In step S102, based on the three-dimensional CAD data 12 received in step S101, the CPU 10g performs processing for displaying, as a wire frame model or a surface model, CG (computer graphics) of an object defined in virtual space. As described above, in the present embodiment, the object defined in the virtual space is a multilayer printed circuit board. Thus, in step S102, the contours of conductors and dielectrics included in the multilayer printed circuit board are displayed on the output device 10a. Functions for changing the direction of the line of sight and the depth of point of view relative to the CG and functions for changing the magnification of the CG displayed on the screen of the output device 10a are provided on the screen or at a peripheral portion thereof. The functions may include, for example, mouse dragging and a slide bar.

In step S103, the CPU 10g calls and executes a preprocessing subroutine. The preprocessing subroutine is processing that is to be performed before the electromagnetic field strengths are calculated, e.g., processing for spatial discretization.

Figure 4:
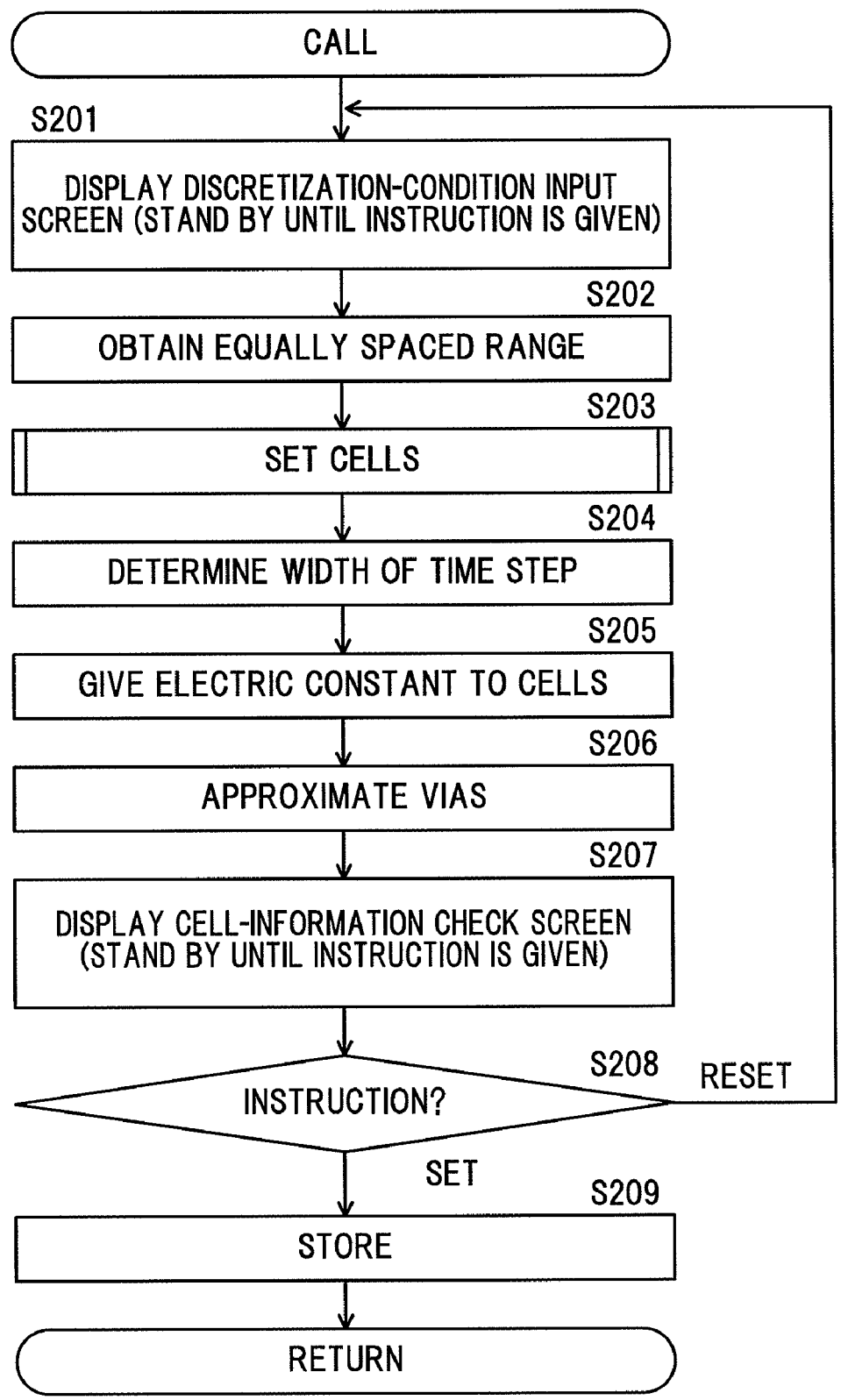
FIG. 4 illustrates a flow of a preprocessing subroutine.

FIG. 4 illustrates a flow of the preprocessing subroutine.

Figure 5:
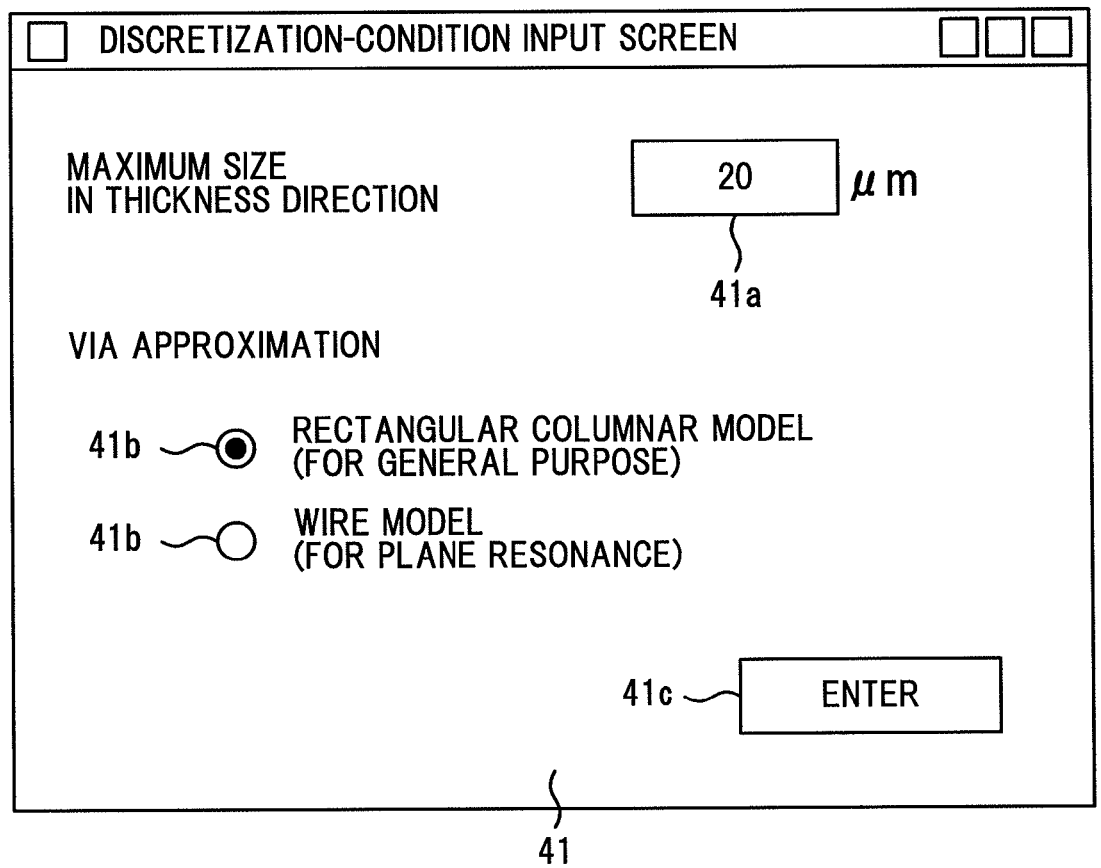
FIG. 5 illustrates one example of a discretization-condition input screen.

After the start of the preprocessing subroutine, in initial step S201, the CPU 10g performs processing for displaying a discretization-condition input screen on the output device 10a. The discretization-condition input screen is used to enter, as a condition, information needed for spatial discretization. More specifically, in step S201, the CPU 10g performs processing for displaying a discretization-condition input screen 41 as illustrated in FIG. 5. The discretization-condition input screen 41 has an entry field, for example, a text box 41a, for inputting an upper-limit value of the size of cells in the thickness direction of the multilayer printed circuit board. The discretization-condition input screen 41 further has a selecting function, for example, a pair of radio buttons 41b, for selecting between a rectangular columnar model and a wire model to which vias included in the multilayer printed circuit board are to be approximated. Approximation of the vias to the rectangular columnar model is suitable for analysis of general electromagnetic waves, whereas approximation of the vias to the wire model is suitable for analysis of electromagnetic waves radiated by plane resonance between a power layer and a ground layer. The reason is described below. The discretization-condition input screen 41 further has an instructing function, for example, an enter button 41c, for starting processing for discretizing the virtual space. After performing the processing for displaying a discretization-condition input screen 41 as illustrated in FIG. 5, the CPU 10g stands by until an instruction for discretizing the virtual space is given via the instructing function. When the operator of the operation device 10b enters the upper-limit value of the thickness-direction cell dimension into the entry field, determines the via-approximation method via the selecting function, and then gives an instruction for the virtual-space discretization via the instructing function, the CPU 10g advances the process to step S202.

Figure 6:
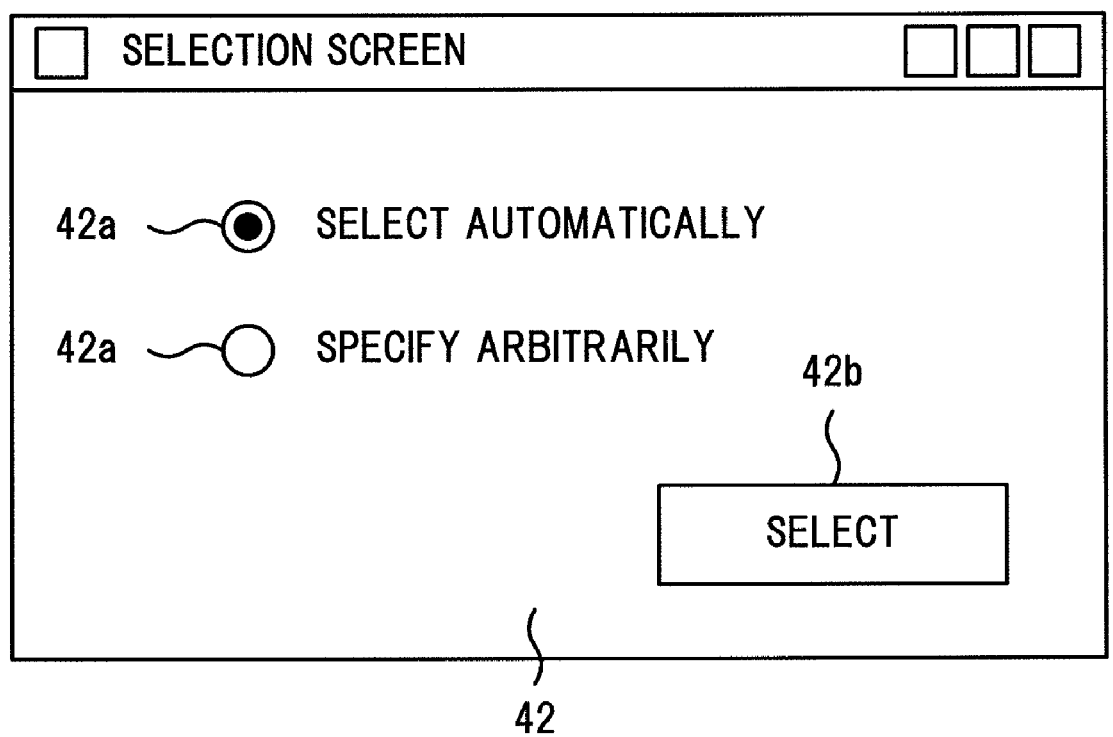
FIG. 6 illustrates one example of a selection screen.

In step S202, the CPU 10g performs processing for obtaining an equally spaced range used in a cell-setting subroutine described below. The "equally spaced range" as used herein refers to a range in which the nodes of the cells are arranged at regular intervals in a plane parallel to the multilayer printed circuit board. More specifically, in step S202, the CPU 10g performs processing for displaying, on the output device 10a, a selection screen 42 as illustrated in FIG. 6. The selection screen 42 has a selecting function, for example, a pair of radio buttons 42a, for selecting whether the simulation apparatus 10 is to automatically select the equally spaced range or the operator is to autonomously determine an arbitrary range as the equally spaced range. The selection screen 42 has an instructing function, for example, a select button 42b, for starting the determination method selected via the selecting function. When the operator of the operation device 10b selects that the simulation apparatus 10 is to automatically select the equally spaced range, the CPU 10g determines, as the equally spaced range, a smallest rectangular range including a contour obtained by projecting the multilayer printed circuit board onto the plane parallel thereto. On the other hand, when the operator decides to autonomously determine an arbitrary range as the equally spaced range, the CPU 10g stands by until the mouse is dragged to the multilayer-printed-circuit-board CG displayed in step S102 in FIG. 3. When the operator determines an arbitrary rectangular range by dragging the mouse with respect to the plane parallel to the multilayer printed circuit board, the CPU 10g receives the arbitrary rectangular range as the equally spaced range.

In step S203, the CPU 10g calls and executes the aforementioned cell-setting subroutine. The cell-setting subroutine is processing for setting cells in the virtual space.

Figure 7:
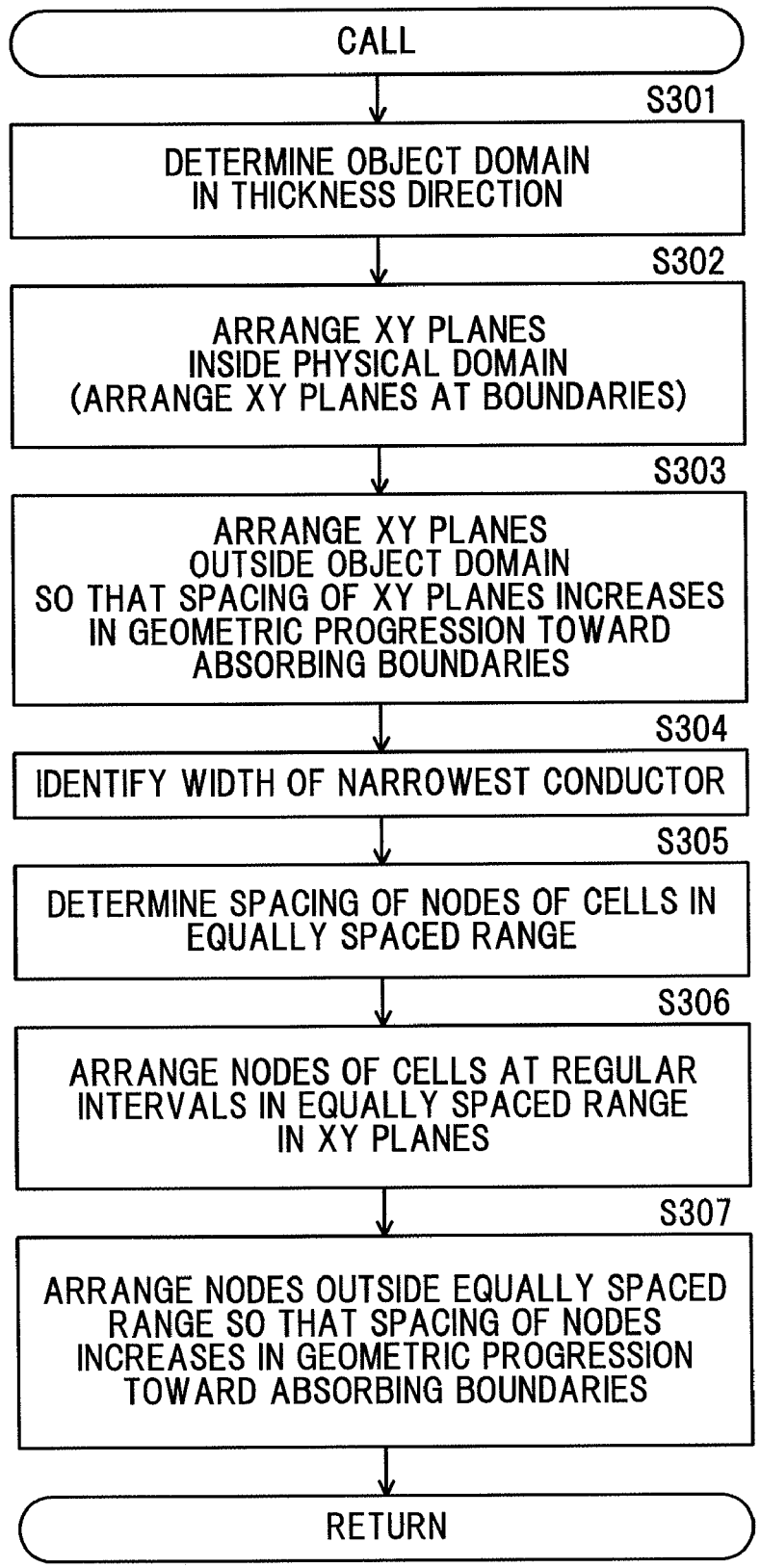
FIG. 7 illustrates a flow of the cell-setting subroutine.

FIG. 7 illustrates a flow of the cell-setting subroutine.

After the cell-setting subroutine is started, in initial step S301, the CPU 10g determines, as an object domain, a section from one edge of the multilayer printed circuit board to another opposite edge of the multilayer printed circuit board in the thickness direction thereof, based on the three-dimensional CAD data received in step S101 in FIG. 3.

Figure 8:
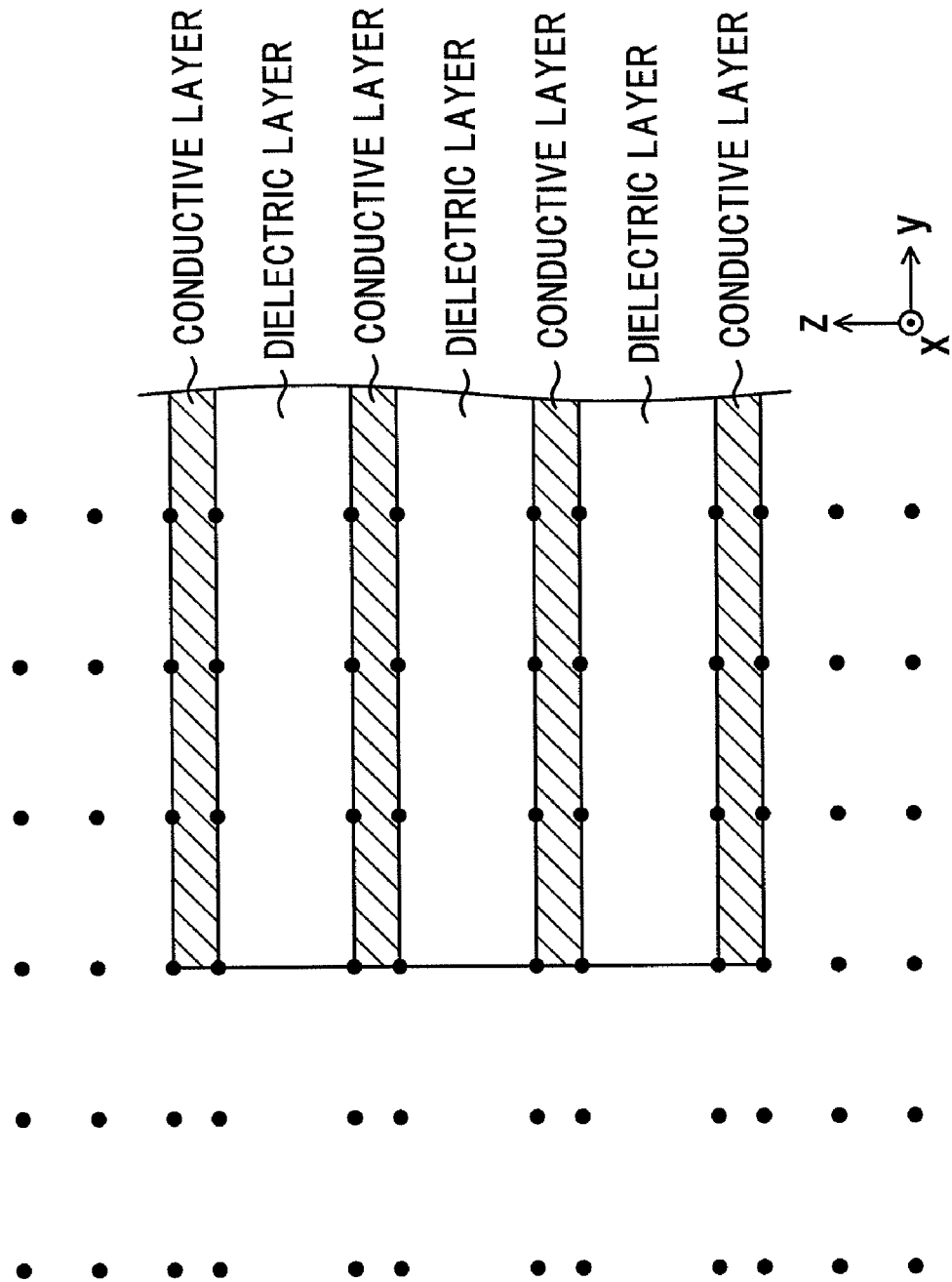
FIG. 8 is a view illustrating an example of a state in which the nodes of cells are arranged in virtual space in which the shape of a multilayer printed circuit board is defined, the state being viewed in a direction perpendicular to the thickness direction.

In step S302, the CPU 10g arranges XY planes inside the object domain determined in step S301. The XY planes are virtual planes for arranging nodes of cells and are parallel to the multilayer printed circuit board. More specifically, in step S302, the CPU 10g identifies each boundary between a conductive layer and a dielectric layer of the multilayer printed circuit board based on the three-dimensional CAD data received in step S101 in FIG. 3. The CPU 10g then arranges XY planes so that they agree with the identified boundaries. When the spacing of the identified boundaries exceeds the upper-limit value of the cell dimension in the thickness direction, the upper-limit value being received in step S201 in FIG. 4, the CPU 10g arranges one or more XY planes at the boundaries at regular intervals so that the spacing of the XY planes does not exceed the upper-limit value. In this case, in order to reduce the number of cells set in the virtual space, the CPU 10g performs adjustment so that the number of XY planes at the boundaries is reduced without exceeding the upper-limit value thereof. FIG. 8 is a view illustrating an example of a state in which the nodes of cells are arranged in virtual space in which the shape of a multilayer printed circuit board is defined, the state being viewed in a direction perpendicular to the thickness direction. In FIG. 8, a portion including edges of the multilayer printed circuit board is enlarged so that the relationships of the nodes of the cells arranged in space outside of the multilayer printed circuit board, the conductive layers, and the dielectric layers become distinct. The vertical direction (z direction) in FIG. 8 corresponds to the thickness direction of the multilayer printed circuit board. In FIG. 8, black dots represent the nodes of the cells. Thus, in FIG. 8, the nodes arranged horizontally in one row belong to the same XY plane. As illustrated in FIG. 8, each XY plane is arranged so as to agree with the corresponding boundary between the conductive layer and the dielectric layer.

Referring back to FIG. 7, in step S303, the CPU 10g arranges XY planes outside the object domain determined in step S301. In this case, the CPU 10g adjusts the spacing of the XY planes so that the spacing thereof increases in geometric progression toward absorbing boundaries for determination of the electromagnetic field strengths, i.e., toward the outer edges of the virtual space. FIG. 9 is a view illustrating an example of the state in which the nodes of the cells are arranged in the virtual space in which the shape of the multilayer printed circuit board is defined, the state being viewed in a direction perpendicular to the thickness direction. FIG. 9 illustrates the entire virtual space so that the spacing of the nodes of the cells arranged in the space outside the printed circuit board is made distinct. The vertical direction (z direction) in FIG. 9 corresponds to the thickness direction of the multilayer printed circuit board. In FIG. 9, black dots represent the nodes of the cells. As illustrated in FIG. 9, the nodes of the cells are arranged outside the multilayer printed circuit board in the thickness direction thereof so that the spacing of the nodes increases in geometric progression toward the outside.

In step S304 in FIG. 7, the CPU 10g identifies a width of a narrowest conductor in the circuit pattern formed at the conductors in the conductive layers, based on the three-dimensional CAD data received in step S101 in FIG. 3.

In step S305, the CPU 10g determines the spacing of the nodes of the cells in the equally spaced range obtained in step S202 in FIG. 4. More specifically, the CPU 10g determines the spacing of the nodes of the cells in the equally spaced range so that the spacing is in a range that does not exceed a specific value (e.g., a range that is five-sixths or less of the narrowest-conductor width) corresponding to the narrowest-conductor width identified in step S304. The range may be determined using a method in which the CPU 10g automatically determines the spacing of the nodes of the cells (e.g., five-sixths of the narrowest-conductor width) so as to reduce the number of cells. For example, the CPU 10g may prompt the operator to select, via a receiving function (e.g., a dialog box), the spacing in a range that is smaller than or equal to five-sixths of the narrowest-conductor width. The aforementioned specific value may be specified to be in a range in which a circuit wire model obtained by modeling the circuit wiring in the circuit pattern does not develop a wiring break.

A conductor electric constant may be given to, among the cells set in the virtual space, cells at positions corresponding to the circuit wiring in the circuit pattern to model the circuit wiring. In such a case, the resulting circuit wire model may develop a wiring break or the eye-pattern quality or the like of a signal introduced into the circuit wire model may deteriorate, depending on the size of the cells. For example, conducting wires with a width of 60 μm may be used as the conducting wires of multiplayer printed circuit boards integrated into mobile phones. It is now assumed that cells, each having dimensions of 50 μm×50 μm in the x and y directions, are set in virtual space including a multilayer printed circuit board in which a circuit wire having a conducting-line width of 60 μm is placed obliquely relative to the x and y directions. It is further assumed that a conductor electric constant is given to cells located at positions corresponding to the circuit wire to thereby model the circuit wire into a circuit wire model 51 as illustrated in FIG. 10A. The circuit wire model 51 does not have a complete wiring break but is in a state that is close to a wiring break. In addition, it is assumed that cells, each having dimensions of 40 μm×40 μm in the x and y directions, are set in the same virtual space and a conductor electric constant is given to cells located at positions corresponding to the circuit wire to thereby model the circuit wire into a circuit wire model 52 as illustrated in FIG. 10B. Thus, the circuit wire model 52 has such a thickness that does not cause deterioration of the quality of a signal introduced into the circuit wire model 52. In step S305 in the present embodiment, the upper-limit value of the spacing of the nodes of the cells in the equally spaced range is set to five-sixths of the narrowest-conductor width as a limit at which the circuit wire model does not develop a complete wiring break. When the FDTD simulator 13 is used for analyzing the quality of a signal in the multilayer printed circuit board, the upper-limit value of the spacing of the nodes of the cells in the equally spaced range may be four-sixths of the narrowest-conductor width.

In step S306, the CPU 10g arranges the nodes of the cells so that they are spaced at regular intervals in both the x and y directions inside the equally spaced range in the XY planes arranged in the virtual space in step S302. In this case, in order to reduce the number of cells set in the equally spaced range, the CPU 10g performs adjustment so that the number of nodes of the cells is reduced in a range in which the spacing of the nodes of the cells does not exceed the upper-limit value determined in step S305. That is, the nodes of the cells are equally spaced, in the equally spaced range, at regular intervals with spacing that is five-sixths or less of the narrowest-conductor width.

Figure 11:
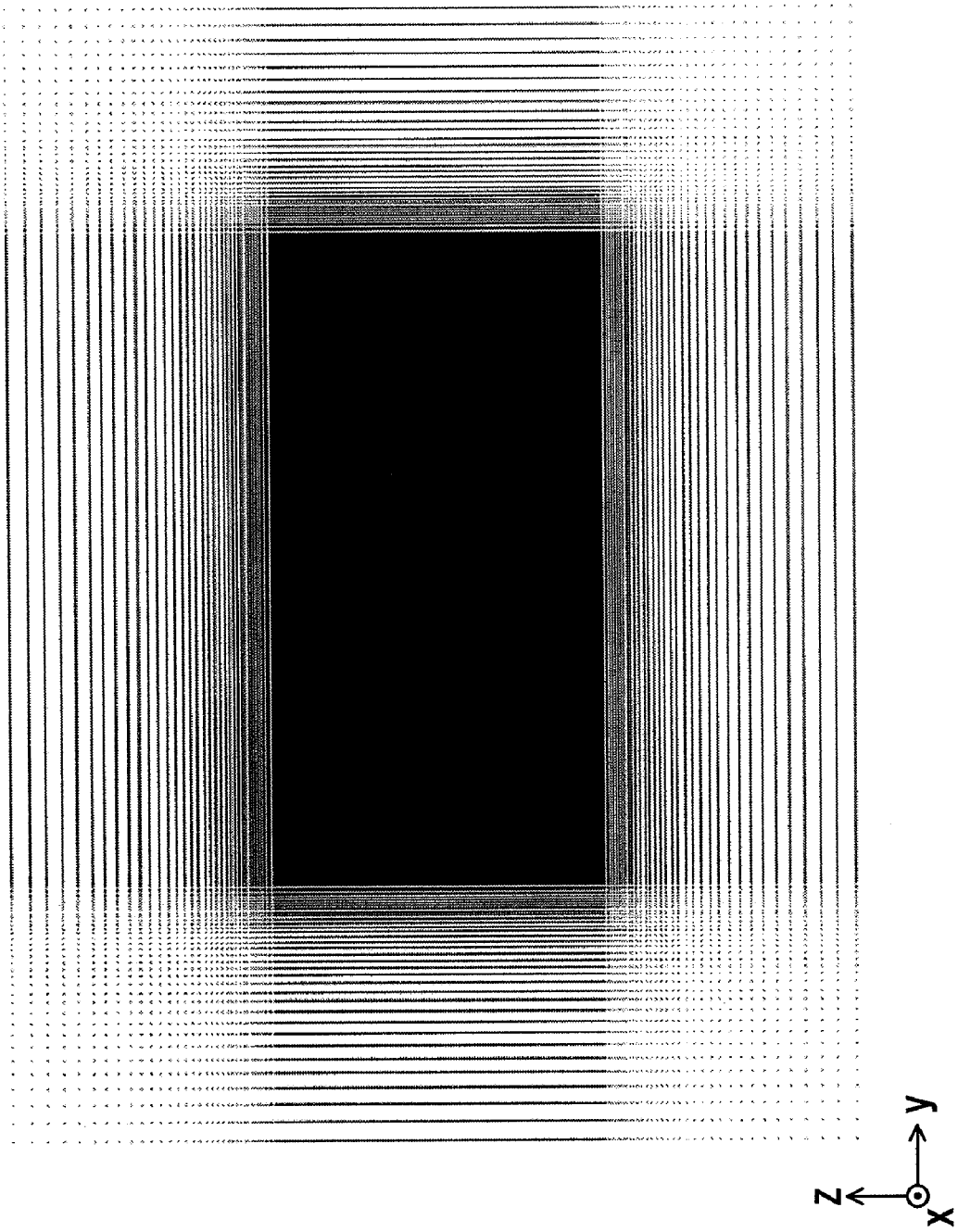
FIG. 11 is a view illustrating an example of the state in which the nodes of the cells are arranged in virtual space in which the shape of the multilayer printed circuit board is defined, the state being viewed in the thickness direction.

In step S307, the CPU 10g arranges the nodes of the cells outside the equally spaced range in the XY planes arranged in the virtual space in step S302. In this case, the CPU 10g adjusts the spacing of the XY planes so that the spacing thereof increases in geometric progression toward the absorbing boundaries for determination of the electromagnetic field strengths, i.e., toward the outer edges of the virtual space. FIG. 11 is a view illustrating an example of the state in which the nodes of the cells are arranged in the virtual space in which the shape of the multilayer printed circuit board is defined, the state being viewed in the thickness direction. FIG. 11 illustrates the entire virtual space so that the spacing of the nodes of the cells arranged in the space outside the multilayer printed circuit board is made distinct. The direction (z direction) perpendicular to the plane of FIG. 11 corresponds to the thickness direction of the multilayer printed circuit board. In FIG. 11, black dots represent the nodes of the cells. As indicated by the spacing of the vertical and horizontal nodes in FIG. 11 and the spacing of the horizontal nodes in FIG. 9, at positions outside the multilayer printed circuit board in the plane parallel thereto, the nodes of the cells are arranged so that the spacing thereof increases in geometric progression toward the outside.

By executing steps S301 to S307 described above, the CPU 10g arranges the nodes of the cells in the virtual space in which the shape of the multilayer printed circuit board is defined and then finishes the cell-setting subroutine illustrated in FIG. 7.

Steps S301 to S307 (step S203) described above and steps S201 and S202 in FIG. 4 are examples of a setting process.

Upon completion of the cell-setting subroutine, the CPU 10g returns to the preprocessing subroutine illustrated in FIG. 4 and advances the process from step S203 to step S204.

In step S204, the CPU 10g determines the width of a time step, which is a time interval for calculating electromagnetic field strengths. More specifically, the CPU 10g obtains the minimum value of the spacing of the XY planes arranged in the object domain in step S302 in FIG. 7 and the minimum value of the x-and-y direction spacing of the cells arranged inside the equally spaced range in step S306 in FIG. 7. Based on the minimum values of cell dimensions $\Delta x$, $\Delta y$, and $\Delta z$ in the respective x, y, and z directions, the CPU 10g determines a maximum time-step width $\Delta t$ that satisfies the CFL (Courant-Friedrich-Levy) condition, or the Courant-Friedrichs-Lewy condition, given by:

$$\Delta t \leq \frac{1}{c\sqrt{\frac{1}{\Delta x^2} + \frac{1}{\Delta y^2} + \frac{1}{\Delta z^2}}} \quad (26)$$

The symbol "c" in equation (26) denotes a speed of light in free space and the unit of measure is meters per second (m/s).

In step S205, with respect to each cell set in the virtual space in step S203, the CPU 10g performs processing for giving a medium electric constant, e.g., the electric permittivity "∈", the magnetic permeability "μ", or the electrical conductivity "σ", of a medium (e.g., conductor, insulator, or air) occupying a large area of the cell. In step S205, the circuit pattern formed at a conductor is modeled in the following manner. For example, when processing in step S306 in FIG. 7 is performed on a conductive layer in which two parallel rectangular circuit wires 61 and 62 are arranged so that they are spaced apart from each other in the lateral direction thereof and overlap each other slightly in the longitudinal direction, a relationship between the circuit wires 61 and 62 and cells as illustrated in FIG. 12A is obtained. As illustrated in FIG. 12A, the edges of the circuit wires 61 and 62 are not traced by the edges of the cells. Dotted lines in the grids in FIGS. 12A and 12B represent boundaries of the cells. When the processing in step S205 is performed on virtual space in which cells are set as in FIG. 12A, an electric constant of the circuit wires 61 and 62 is given to cells whose areas are largely occupied by the circuit wires 61 and 62, as illustrated in FIG. 12B. Consequently, the circuit wires 61 and 62 are modeled into cells given the electric constant, i.e., into circuit wire models 63 and 64. Since the edges of the circuit wire models 63 and 64 agree with the boundaries of the cells, the overlapping portions of the circuit wires 61 and 62 are eliminated by the modeling. As a result of such modeling, the shape of each circuit wire is deformed. However, when the signal frequency is on the order of gigahertz, the amount of deformation is sufficiently small compared to the signal wavelength. The deformation, therefore, has almost no influence on the strength of electromagnetic fields radiated from the pattern.

In step S206, the CPU 10g performs processing for approximating vias. More specifically, the CPU 10g first locates circular columnar or circular tubular vias included in the multilayer printed circuit board, based on the three-dimensional CAD data received in step S101 in FIG. 3. Subsequently, the CPU 10g determines whether the via-approximation method received in step S201 is to approximate the vias to the rectangular columnar model or the wire model. When the via-approximation method is to approximate the vias to the rectangular columnar model, the CPU 10g performs the following processing on each of the located vias. That is, the CPU 10g locates a smallest rectangular columnar domain including the cells that were given the electric constant of the via medium in step S205 and gives the same electric constant to all cells included in the located rectangular columnar domain. For example, in FIG. 13A, cells whose areas are largely occupied by the medium of the circular tubular via 71 are indicated by hatching, and in step S205, the electric constant of the medium of the via 71 is given to the hatched portions. As illustrated in FIG. 13A, when the via 71 is simply modeled, the shape of the cross section that is perpendicular to the thickness direction of the via model (i.e., to the center axis direction of the via 71) is distorted. When the via 71 is a through-hole via, the through hole is also modeled. In step S206, the CPU 10g first specifies a smallest rectangular columnar domain that has the same height in the thickness direction as the via and that includes the hatched cells illustrated in FIG. 13A. Subsequently, the size in directions perpendicular to the center axis of the specified rectangular columnar domain is adjusted in the following manner. The size in the directions perpendicular to the center axis of the specified rectangular columnar domain is adjusted so as to be larger than the size of a rectangle inscribed in a circle, which is the shape of the cross section perpendicular to the center axis of the side surface (i.e., the circular columnar surface) of the via 71, and so as to be smaller than a rectangle circumscribed around the circle. That is, the number of cells included in the rectangular columnar domain is adjusted. In this case, when the via 71 is a through-via hole, the circle that serves as a reference of the inscribing or circumscribing is the cross-sectional shape of the outer side surface of the via 71, not the inner side surface thereof. The nodes of the cells included in the rectangular columnar domain whose size has been adjusted are removed so that all cells included therein become a single rectangular columnar cell. Thereafter, the electric constant of the medium of the via 71 is given to the single rectangular columnar cell. Through the processing described above, the circular tubular via 71 is modeled and is then approximated to a rectangular columnar domain given the electric constant, i.e., to a rectangular columnar via model 72 formed on the single cell. In FIG. 13B, the cell included in the rectangular columnar domain is hatched. That is, in FIG. 13B, the cross-sectional shape of the rectangular columnar via model 72 is illustrated by hatching. The reason why the adjustment width is specified for the size of the cross-sectional shape of the via model 72 and the reason why the circular tubular via may be approximated to the hole-less rectangular columnar shape are described below. When the via-approximation method is to approximate the vias to the wire model, the CPU 10g performs the following processing on each located via. That is, the CPU 10g gives an insulator electric constant to cells that were given the via electric constant in step S205, and gives, as a fixed value, an electric field strength of 0 to edges of cells that lie in the vicinity of the center axis of the via and that have the same height in the thickness direction as the via. As a result, for example, a circular tubular via 71 illustrated in FIG. 14A is modeled and is then approximated to a line-segment via model 73 as illustrated in FIG. 14B. In this case, an electric constant, such as an electrical conductivity, cannot be given to the edges of the cells. Thus, in step S206 in FIG. 4, an electric-field strength of 0 is given to the edges of the cells as a fixed value.

Steps S205 and S206 are examples of a giving process.

Figure 15:
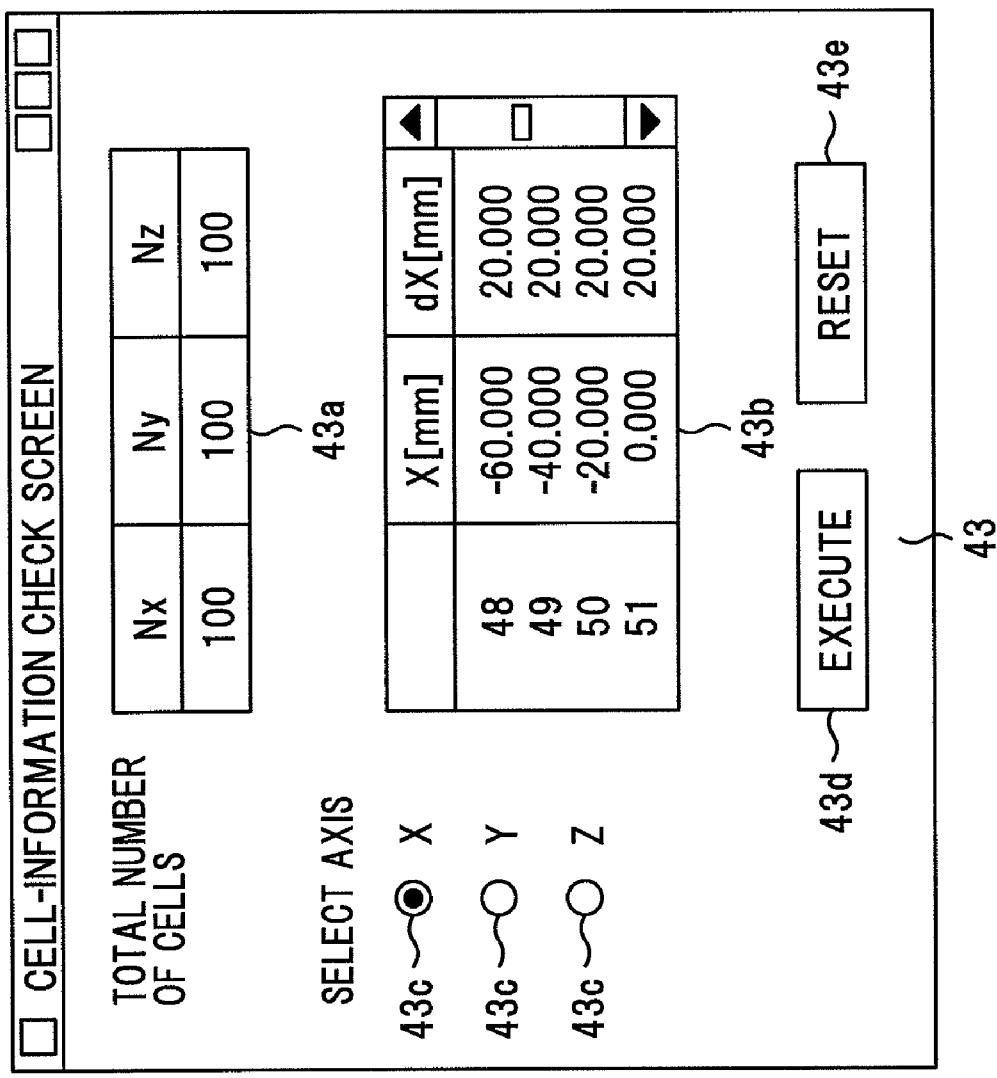
FIG. 15 illustrates one example of a cell-information check screen.

In step S207, the CPU 10g performs processing for displaying a cell-information check screen on the output device 10a. The cell-information check screen serves to present cell information regarding the cells set in step S203. More specifically, the CPU 10g performs processing for displaying a cell-information check screen 43 as illustrated in FIG. 15. The cell-information check screen 43 has a presenting function, for example, a table 43a, for presenting, in the x, y, and z directions, the number of cells set in the virtual space. The cell-information check screen 43 further includes another presenting function, for example, a table 43b, for presenting the coordinates and the spacing of the cells in any of the x, y, and z directions. The presenting function may also present an electric constant given to the cells. When the via-approximation method is to approximate the vias to the wire model, the presenting function may present an electric-field strength of 0, which is a fixed value given to the edges of the cells. In any case, the cell information includes the number of cells, the coordinates of the nodes, the spacing of the nodes (the width of the cells), an electric constant given to the cells, and an electric-field strength of 0, which is a fixed value given to the edges of the cells. The cell-information check screen 43 has a selecting function, for example, a set of three radio buttons 43c, for selecting, from the x, y, and y directions, a direction in which the coordinates and the spacing of the nodes of the cells are to be presented onto the presenting function. The cell-information check screen 43 has an instructing function, for example, an execute button 43d, for fixing the cell settings, indicated by the presented cell information. The cell-information check screen 43 also has an instructing function, for example, a reset button 43e, for proceeding to a phase in which changes are made to the cell information to reset the cells. After performing the processing for displaying a cell-information check screen 43 as illustrated in FIG. 15, the CPU 10g stands by until the operator of the operation device 10b gives, via the instructing function, the instruction for fixing the cell settings or resetting the cells. When the operator gives, via the instructing function, the instruction for fixing the cell settings or resetting the cells, the CPU 10g advances the process to step S208.

In step S208, the CPU 10g determines whether the instruction given with respect to a cell-information check screen 43 as illustrated in FIG. 15 is the instruction for fixing the cell settings or the instruction for resetting the cells. When the instruction given with respect to a cell-information check screen 43 as illustrated in FIG. 15 is to reset the cells, the CPU 10g returns the process from step S208 to step S201. When the instruction given with respect to a cell-information check screen 43 as illustrated in FIG. 15 is to fix the cell settings, the CPU 10g advances the process from step S208 to step S209.

In step S209, the CPU 10g performs processing for storing the cell information in the storage unit 10f in association with the three-dimensional CAD data 12 received in step S101 in FIG. 3.

After executing steps S201 to S209 described above, the CPU 10g completes the cell setting in the virtual space and then finishes the preprocessing subroutine illustrated in FIG. 4.

Upon completion of the preprocessing subroutine, the CPU 10g returns to the main routine illustrated in FIG. 3 and advances the process from step S103 to step S104.

In step S104, the CPU 10g performs processing for displaying an execution-condition input screen on the output device 10a. The execution-condition input screen serves as a screen for receiving execution conditions needed for determining electromagnetic field strengths. Examples of the execution conditions include the position of a wave source, the magnitude of the wave source, an absorbing boundary condition, and the length of time span. The execution-condition input screen has entry fields for entering the execution conditions. The execution-condition input screen also has an instructing function for starting determination of the electromagnetic field strengths and an instructing function for quitting the FDTD simulator 13. After performing the processing for displaying the execution-condition input screen, the CPU 10g stands by until the operator of the operation device 10b gives, via the instructing function, the instruction for starting determination of the electromagnetic field strengths or the instruction for quitting the FDTD simulator 13. When the operator gives, via the instructing function, the instruction for starting determination of the electromagnetic field strength or quitting the FDTD simulator 13, the CPU 10g advances the process to step S105.

In step S105, the CPU 10g determines whether the instruction given with respect to the execution-condition input screen described in step S104 is the instruction for starting determination of the electromagnetic field strengths or the instruction for quitting the FDTD simulator 13. When the instruction given with respect to the execution-condition input screen described in step S104 is the instruction for starting determination of the electromagnetic field strengths, the CPU 10g advances the process from step S105 to step S106.

In step S106, using equations (19) to (21) and (23) to (25) described above, the CPU 10g determines the electric field strengths at the electric-field calculation points 30e and the magnetic field strengths at the magnetic-field calculation points 30h, each time the time step is advanced by one within the time span received in step S104. Upon completion of the processing for determining the electromagnetic field strengths, the CPU 10g advances the process to step S107.

In step S107, the CPU 10g performs processing for displaying an application or the like based on the electromagnetic field strengths determined in step S106. During the display processing, the states of the electromagnetic fields in the space inside or outside the multilayer printed circuit board are represented on the computer. After completion of the display processing, the CPU 10g returns the process to step S104 and performs processing for displaying the execution-condition input screen. Since the process is returned to step S104, the operator may vary the execution conditions to perform electromagnetic-field simulation.

On the other hand, when the instruction given with respect to the execution-condition input screen displayed in step S104 is the instruction for quitting the FDTD simulator 13, the CPU 10g exits the main routine illustrated in FIG. 3.

Via Approximation (Rectangular Columnar Model)

When the operator selects approximation of the via to the rectangular-columnar model in step S201 in FIG. 4, the via 71 is modeled in steps S203 and S205, and then, in step S206, the distorted via model formed on multiple cells is approximated to a rectangular-columnar via model formed on a single cell. In the present embodiment, during the approximation, the size in the directions perpendicular to the center axis of the rectangular columnar domain is adjusted so as to be larger than the size of a rectangle inscribed in a circle, which is the shape of the cross section of the side surface (i.e., the circular columnar surface) of the via, and so as to be smaller than a rectangle circumscribed around the circle. The reason why the adjustment width is specified for the size of the cross-sectional shape of the via model will be described below.

Figure 16A:
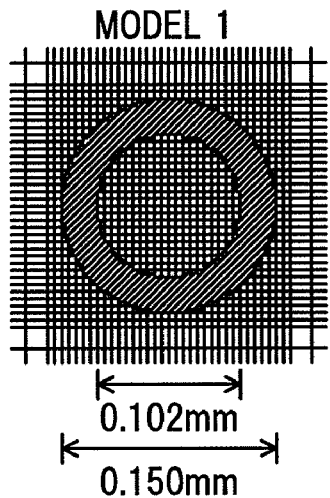
FIGS. 16A to 16G illustrate examples in which a through-hole via having an outer diameter of 0.15 mm and an inner diameter of 0.102 mm is modeled.
Figure 16B:
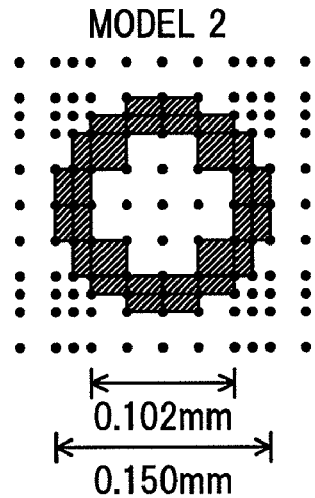

FIGS. 16A and 16B illustrate examples in which a through-hole via having an outer diameter of 0.15 mm and an inner diameter of 0.102 mm is modeled. FIGS. 16C to 16G illustrate an example in which the via model in FIG. 16B is approximated.

Figure 16C:
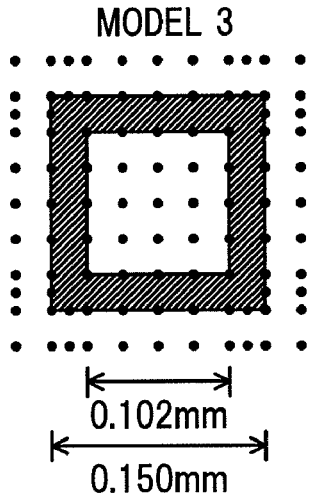
Figure 16D:
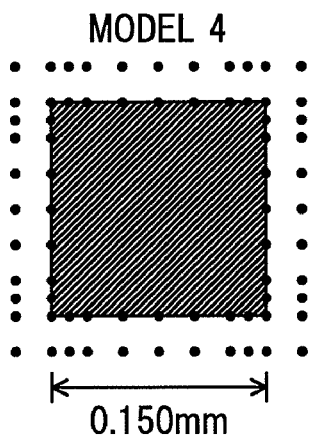
Figure 16E:
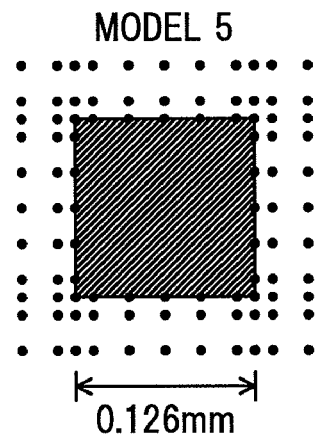
Figure 16F:
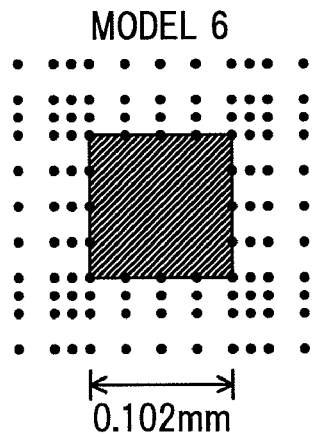
Figure 16G:
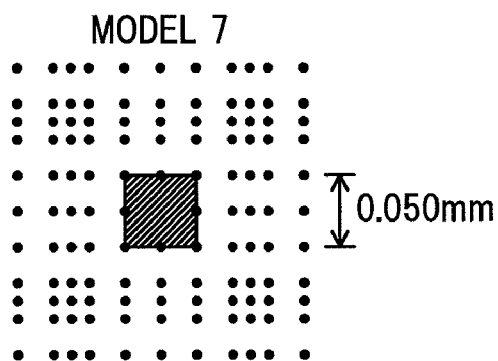

More specifically, FIG. 16A illustrates an example in which a through-hole via is modeled in virtual space. In this case, the virtual space in which the through-hole via is defined is discretized so that the density of the surroundings of the through-hole via becomes particularly high. The example illustrated in FIG. 16A is hereinafter referred to as "model 1". FIG. 16B illustrates an example in which a through-hole via is modeled on a cell having a size of about 0.1 mm in both the x and y directions. The example illustrated in FIG. 16B is hereinafter referred to as "model 2". FIG. 16C illustrates an example in which the through-hole via model is approximated to a rectangular tubular shape on a cell having a size of about 0.1 mm in both the x and y directions. In FIG. 16C, the dimension of each side of the outer rectangle in the cross-sectional shape of the rectangular tube is 0.15 mm, which is the same as the outer diameter of the through-hole via, and the dimension of each side of the inner rectangle is 0.102 mm, which is the same as the inner diameter of the through-hole via. The example illustrated in FIG. 16C is hereinafter referred to as "model 3". FIG. 16D illustrates an example in which the shape of the via model in FIG. 16C is changed from the rectangular tubular shape to a rectangular columnar shape. Thus, in FIG. 16D, the dimension of each side of the cross-sectional shape of the via model is 0.15 mm, which is the same as the outer diameter of the through-hole via. The example illustrated in FIG. 16D is hereinafter referred to as "model 4". FIG. 16E illustrates an example in which the dimension of each side of the cross-section shape of the via model in FIG. 16D is changed to 0.126 mm, which is a value between the outer diameter and the inner diameter of the through-hole via. The example illustrated in FIG. 16E is hereinafter referred to as "model 5". FIG. 16F illustrates an example in which the dimension of each side of the cross-section shape of the via model in FIG. 16D is changed to 0.102 mm, which is the same as the inner diameter of the through-hole via. The example illustrated in FIG. 16F is hereinafter referred to as "model 6". FIG. 16G illustrates an example in which the dimension of each side of the cross-section shape of the via model in FIG. 16D is changed to 0.05 mm. The example illustrated in FIG. 16G is hereinafter referred to as "model 7".

Figure 17:
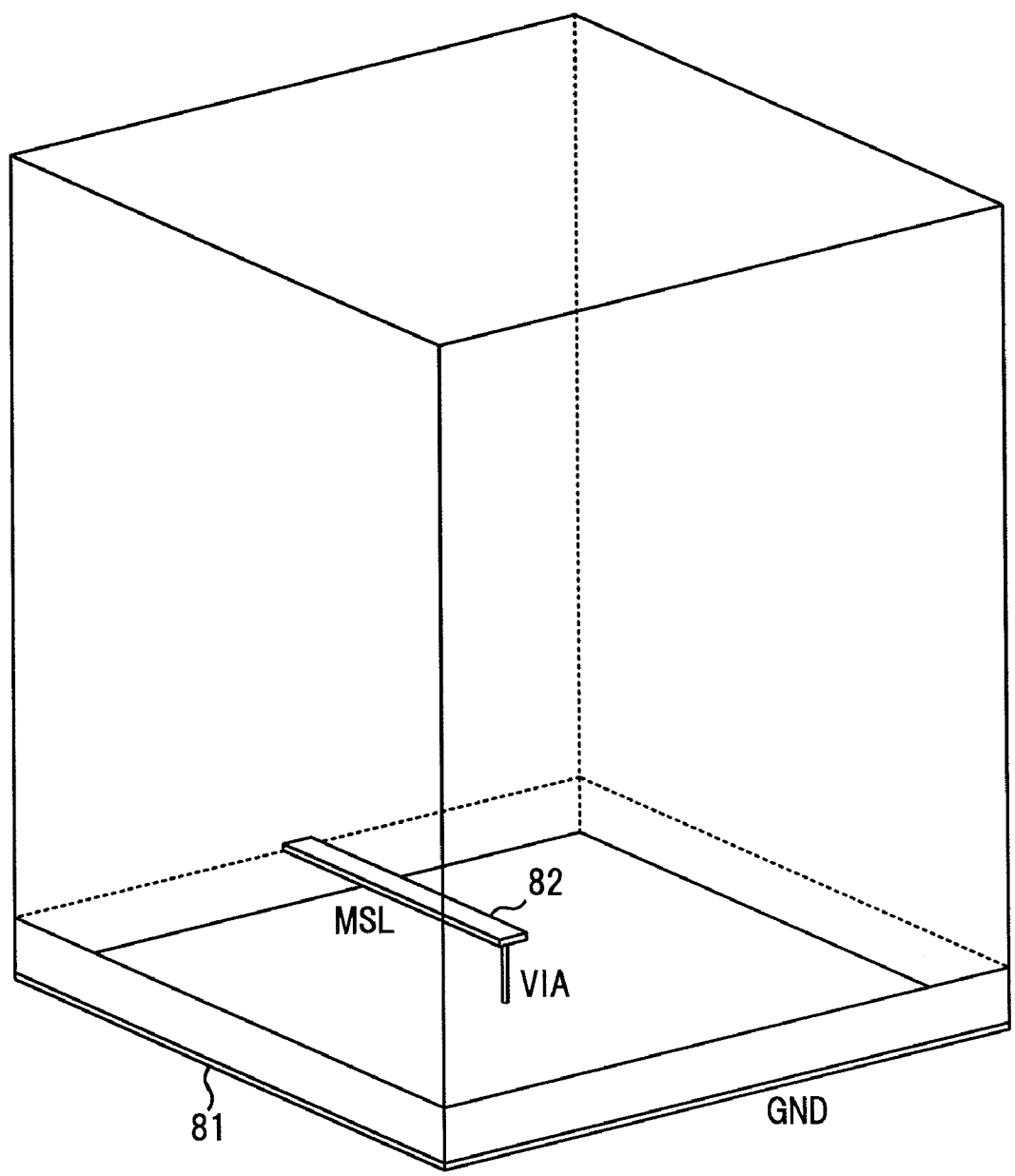
FIG. 17 is a perspective view of analysis space used for evaluating the model illustrated in FIGS. 16A to 16G.
Figure 18:
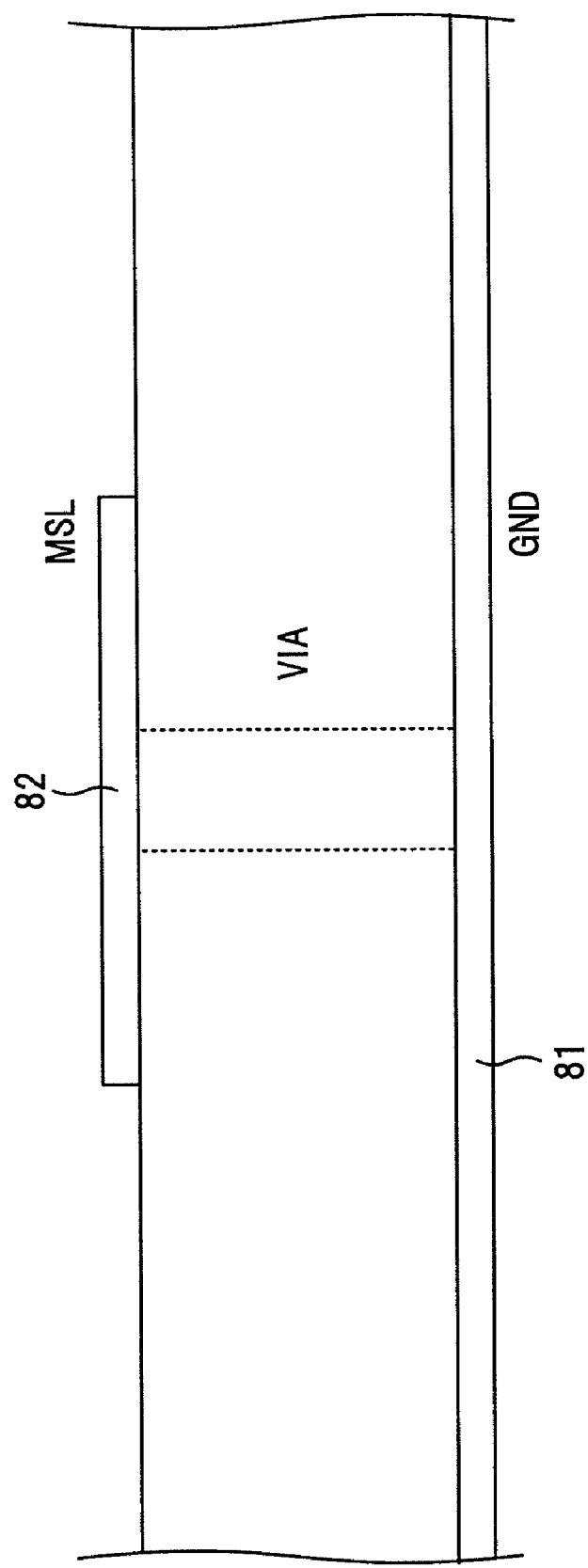
FIG. 18 is a view of the analysis space illustrated in FIG. 17, viewed in a direction perpendicular to the center axis of a via.
Figure 19:
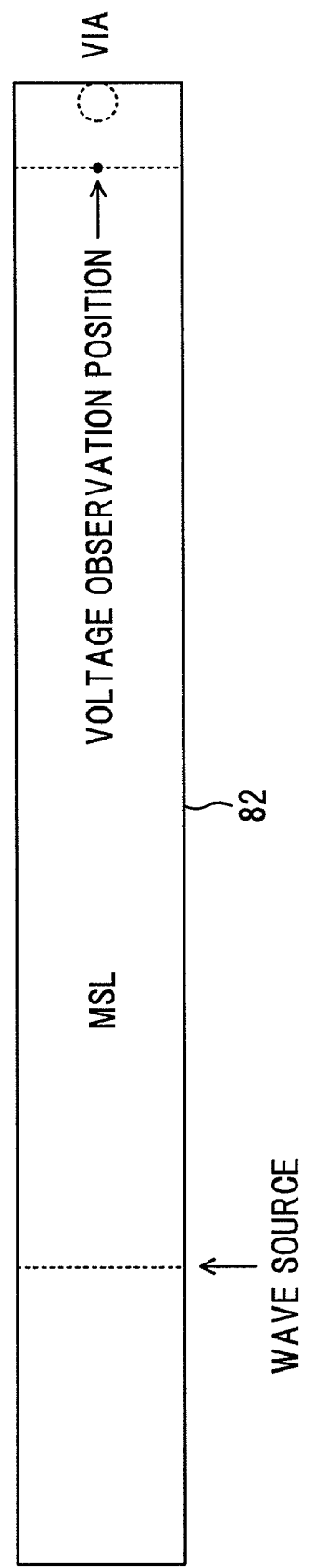
FIG. 19 is a view of the analysis space in FIG. 17, viewed in a direction parallel to the center axis of the via.

FIGS. 17 to 19 illustrate analysis space used for evaluating models 1 to 7 illustrated in FIGS. 16A to 16G. FIG. 17 is a perspective view of the analysis space. FIG. 18 is a view of the analysis space, viewed in a direction perpendicular to the center axis of a via. FIG. 19 is a view of the analysis space, viewed in a direction parallel to the center axis of the via.

In the analysis space illustrated in FIGS. 17 to 19, a ground layer, a dielectric layer, and a signal layer are arranged in order. The dimension in the thickness direction of the analysis space is 1.5 mm and the size in the directions perpendicular to the thickness direction is 1.0 mm×1.0 mm. The ground layer includes a conductor 81 having a thickness of 35 µm and having an electrical conductivity of $5 \times 10^7$ S/m. The dielectric layer includes an insulator having a thickness of 0.3 mm, a relative permittivity of 4.2, and a dielectric loss of 0.0. The signal layer includes a microstrip line (MSL) 82 having a length of 5.075 mm, a width of 0.56 mm, a thickness of 35 µm, an electrical conductivity of $5 \times 10^7$ S/m, and a characteristic impedance Z0 of 50Ω. Each of the models 1 to 7 illustrated in FIGS. 16A to 16G is disposed at one end of the microstrip line 82 so as to provide electrical continuity between the microstrip line 82 and the conductor 81 in the ground layer, as illustrated in FIGS. 17 to 19.

For evaluation of models 1 to 7 illustrated in FIGS. 16A to 16G, a signal voltage with a frequency of 500 MHz to 5 GHz is applied as a wave source at a wave-source position illustrated in FIG. 19, and an impedance at the via is observed from a voltage observation position illustrated in FIG. 19 and is calculated.

Figure 20:
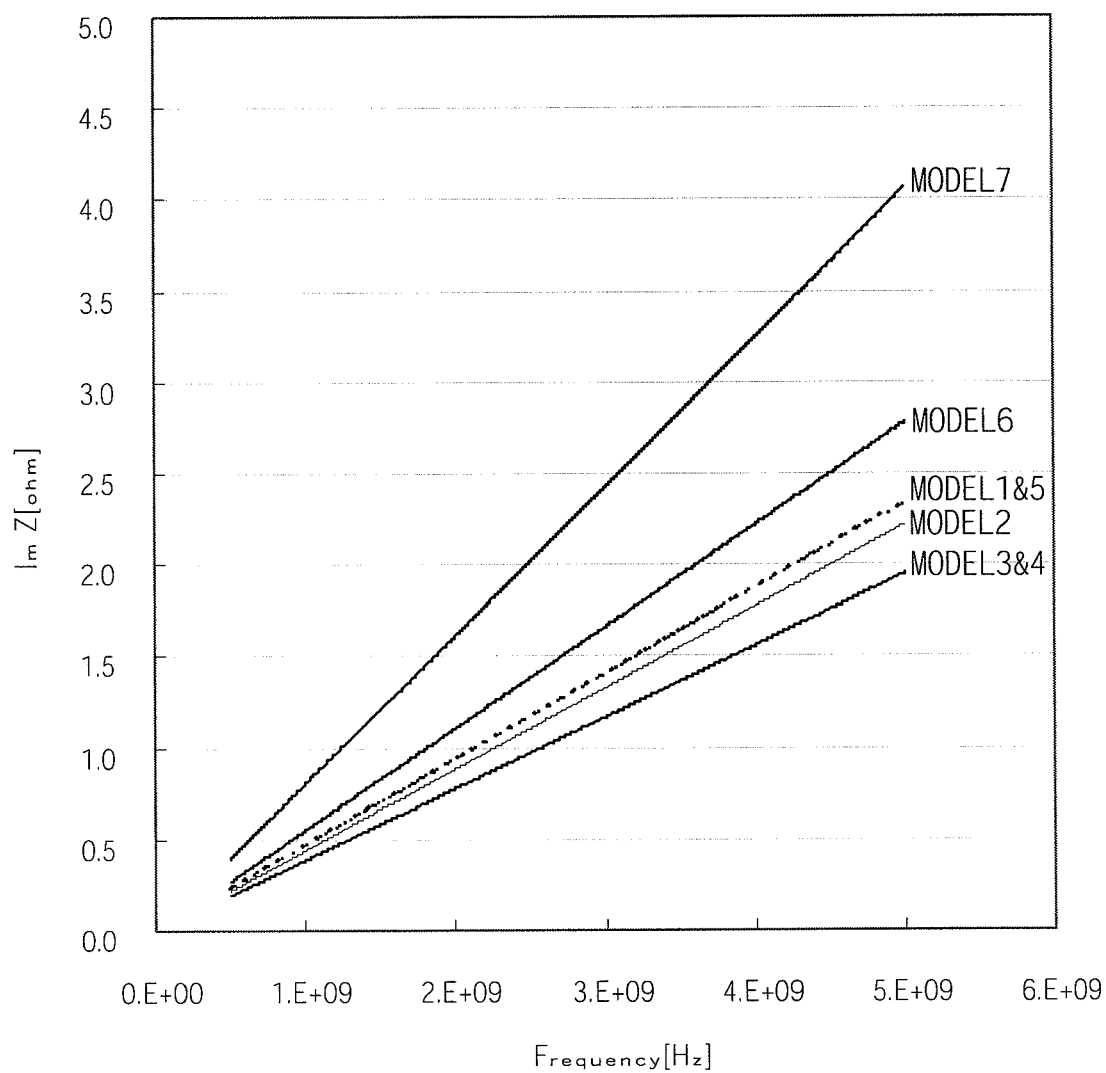
FIG. 20 is a graph depicting the frequency of a signal voltage versus imaginary parts of impedances of models illustrated in FIGS. 16A to 16G.

FIG. 20 is a graph depicting the frequency of the signal voltage versus imaginary parts of the impedances of models 1 to 7 illustrated in FIGS. 16A to 16G.

In the graph of FIG. 20, the graphs of model 3 and model 4 are substantially the same. It may, therefore, be understood that a through-hole via modeled into a rectangular tubular model and a through-hole via modeled into a through-hole-less rectangular columnar model have almost no difference in the analysis results.

The graphical relationships of models 4 to 7 in the graph of FIG. 20 indicate that, when the size of the cross-sectional shape of the rectangular-columnar via model is reduced in the same discretized space, the number of imaginary parts of the impedances tends to increase.

It may also be understood that in the same discretized space, an approximation model that is able to provide a result that is equivalent to the result of model 2 resulting from simple modeling of the through-hole via lies between model 4 and model 6. In this case, the dimension of each side of the cross-sectional shape of model 4 is 0.15 mm, which is the same as the outer diameter of the through-hole via, and the dimension of each side of the cross-sectional shape of model 6 is 0.102 mm, which is the same as the inner diameter of the through-hole via. The dimension of each side of a rectangle inscribed in the 0.15 mm circle is 0.106 mm.

Accordingly, it is desirable that, in step S206 in FIG. 4, the size in the directions perpendicular to the center axis of the specified rectangular columnar domain be adjusted so as to be larger than the size of a rectangle inscribed in a circle, which is the shape of the cross section perpendicular to the center axis of the side surface (i.e., the circular columnar surface) of the via 71, and so as to be smaller than a rectangle circumscribed around the circle.

Determination of the dimension of each side of the cross-sectional shape of a rectangular columnar approximation model that may provide a result that is equivalent to the result of model 2 yields 0.133 mm, which is about 90% of the outer diameter of the through-hole via.

Thus, in step S206 in FIG. 4, it is more desirable that the dimension of each side of the shape of the cross section perpendicular to the center axis of the specified rectangular columnar domain be adjusted so as to approach 90% of the outer diameter of the via 71 as close as possible.

<Wire Model>

In the present embodiment, approximation of vias to the wire model is suitable for analyzing electromagnetic waves radiated by plane resonance between a power layer and a ground layer. This is because characteristics in the plane resonance depend on the size of the plane and thus approximation of the vias to the wire model appears to have no influence. Thus, evaluation of the wire model will now be described.

Figure 21:
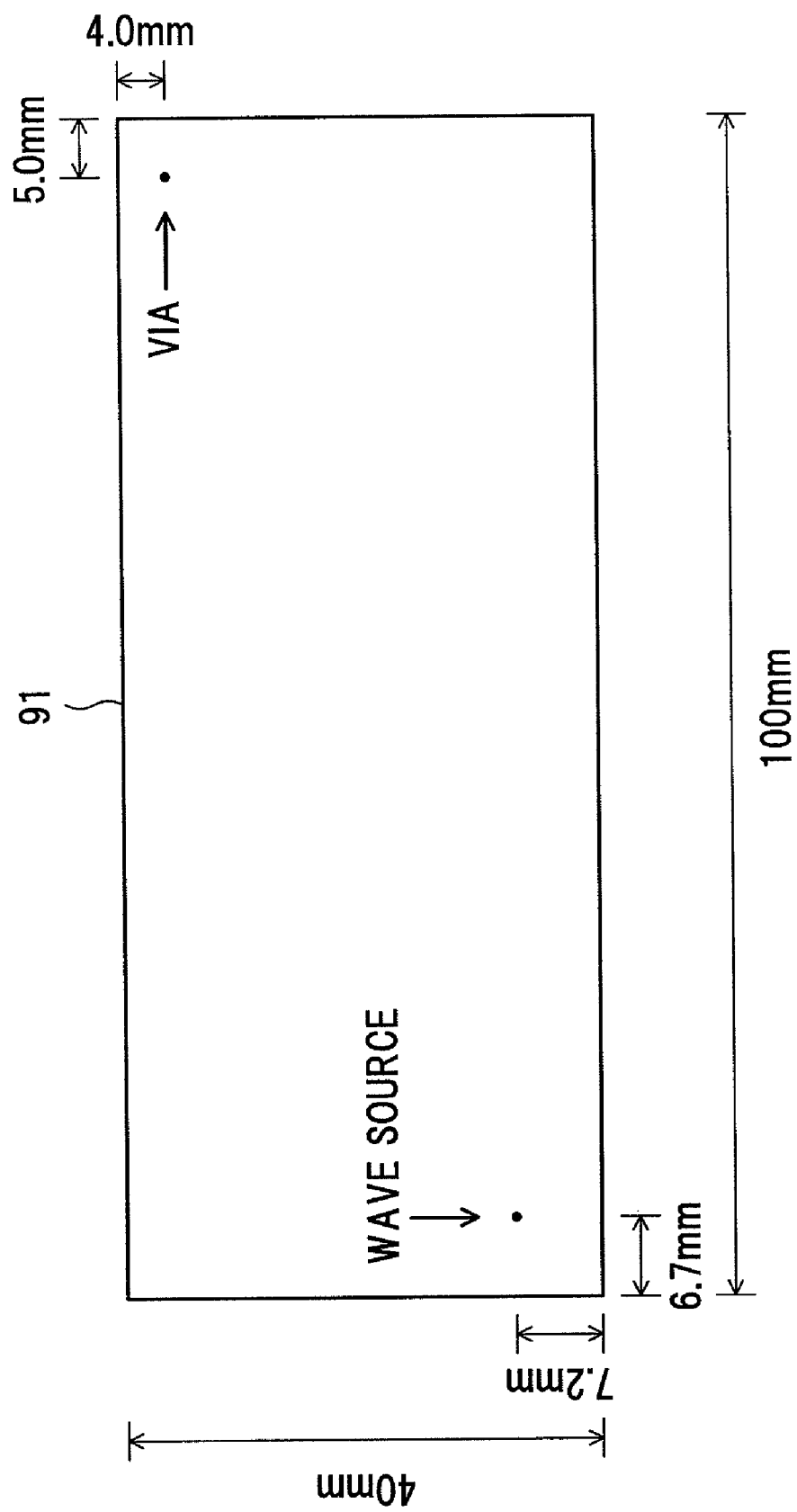
FIG. 21 illustrates the analysis space used for evaluating a rectangular columnar model and a wire model, viewed in a direction parallel to the center axis of a via.
Figure 22:
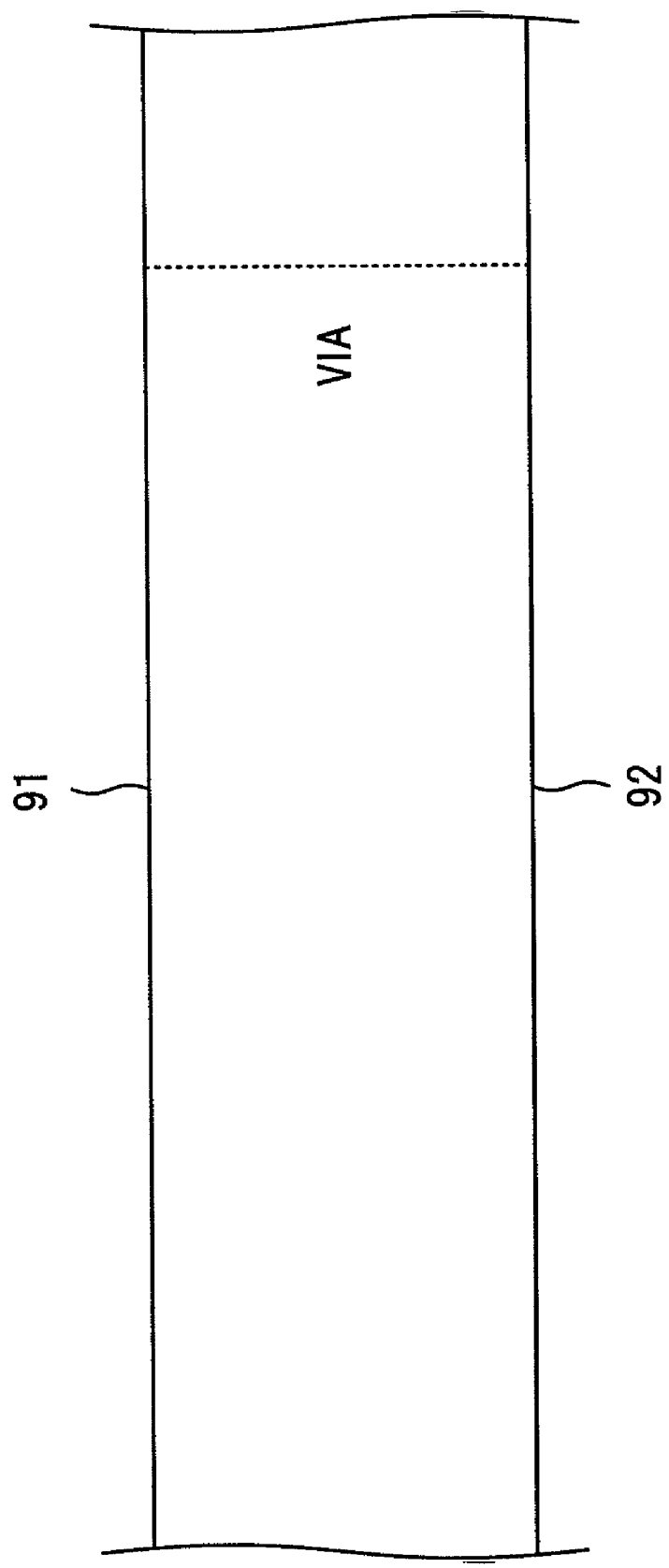
FIG. 22 illustrates the analysis space used for evaluating the rectangular columnar model and the wire model, viewed in a direction perpendicular to the center axis of the via.

FIGS. 21 and 22 illustrate an analysis space used for evaluating the rectangular columnar model and the wire model. FIG. 21 is a view illustrating an analysis space, viewed in a direction parallel to the center axis of a via. FIG. 22 is a view illustrating the analysis space, viewed in a direction perpendicular to the center axis of a via.

In the analysis space illustrated in FIGS. 21 and 22, a power layer, a dielectric layer, and a ground layer are arranged in order. The dimension in the thickness direction of the analysis space is 80 mm and the size in the directions perpendicular to the thickness direction is 180 mm×120 mm. The power layer includes a perfect conductor 91 having a thickness of 0 µm and having an infinite electrical conductivity. The ground layer also includes a perfect conductor 92 having a thickness of 0 µm and having an infinite electrical conductivity. The dielectric layer includes an insulator having a thickness of 336 µm, a relative permittivity of 4.2, and an electrical conductivity of 0.00561 S/m. Although the description in this case has been given of a case in which an electrical conductivity is given to the insulator in the dielectric layer, a dielectric loss may also be given instead of the electrical conductivity.

The perfect conductors 91 and 92 included in the power layer and the ground layer, respectively, are flat plates, each having a longitudinal dimension of 40 mm and a lateral dimension of 100 mm. As illustrated in FIG. 21, signal voltages with a frequency of 0.5 to 2.5 GHz were applied as a wave source at a point located 6.7 mm to the right and 7.2 mm above from the lower left corner of the perfect conductor 91 in the power layer. Reflection losses S11 (dB) were then calculated when a rectangular columnar model and a wire model, each of which provides electrical continuity between the power layer and the ground layer, were placed at a point 4.0 mm below and 5.0 mm to the left from the upper right corner of the perfect conductor 91 in the power layer. The height in the center axis direction (the z direction) of the rectangular columnar model is 0.336 mm and the size in the directions (the x and y directions) perpendicular to the center axis is 1.3 mm×1.3 mm. The dimensions in the x and y directions of cells around the wire model are 1.25 mm and 1.0 mm, respectively.

Figure 23:
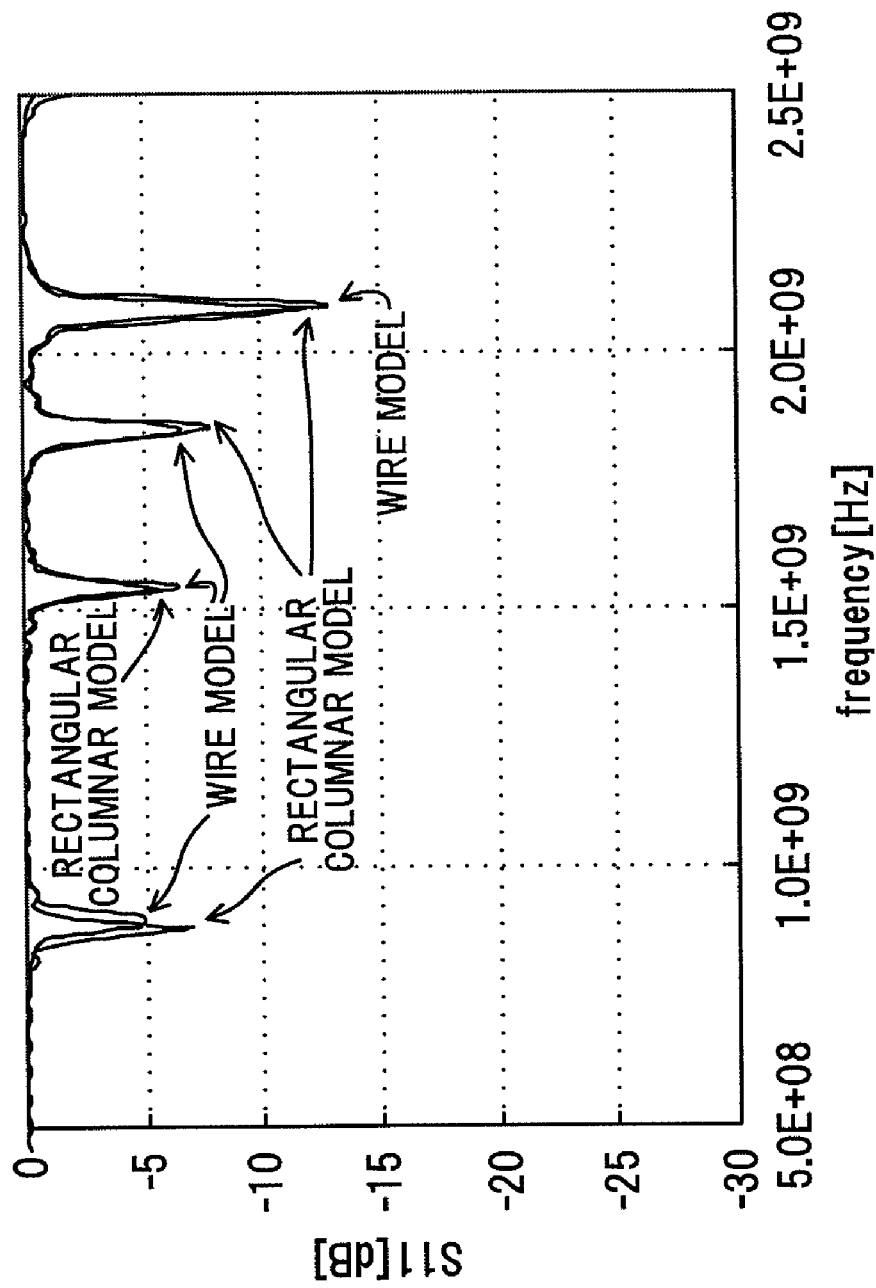
FIG. 23 is a graph depicting reflection losses of the rectangular columnar model and the wire model versus the frequencies of signal voltages.

FIG. 23 is a graph depicting the reflection losses S11 of the rectangular columnar model and the wire model versus the frequencies of the signal voltages.

As illustrated in FIG. 23, the resonance frequencies of the rectangular columnar model and the wire model substantially agree with each other and an error in the reflection loss at the resonant frequency is about 3% at most. It may therefore be understood that, even if the via is approximated to the wire model to reduce the computation time, there is no problem with an analysis of electromagnetic waves radiated by plane resonance.

In the present embodiment, when multiple cells are to be set in virtual space in which the shape of a multilayer printed circuit board is defined, the nodes of the cells are arranged at regular intervals in the plane parallel to the printed circuit board. Thus, no narrow cells are generated in the plane parallel to the printed circuit board. This arrangement may also eliminate the need for processing for detecting edges of circuit wires. This also reduces the amount of time required for discretization of virtual space in which the shape of a printed circuit board is defined and for determination of the electromagnetic field strengths.

According to the present embodiment, when multiple cells are to be set in virtual space in which the shape of a multilayer printed circuit board is defined, the boundary between a conductive layer and a dielectric layer is precisely traced by edges of the cells and the width of the conductive layer is accurately modeled. Thus, according to the present embodiment, errors in numeric values of impedance and so on do not increase.

According to the present embodiment, the spacing of the nodes of cells in an equally spaced domain is five-sixths or less of the width of the narrowest conductor in the circuit pattern. Thus, according to the present embodiment, even when a circuit wire is modeled, the circuit wire model does not develop a wiring break.

According to the present embodiment, since an equally spaced domain may be selected, electromagnetic-field analysis may be performed centering on, in a multilayer printed circuit board, a portion to which the operator is working on.

According to the present embodiment, the spacing of the nodes of the cells increases in a geometric progression toward the absorption boundaries both in the directions parallel to the multilayer printed circuit board and in the thickness direction. With this arrangement, it is possible to significantly reduce the number of cells.

According to the present embodiment, a circular columnar or circular tubular via may be approximated to a rectangular columnar via model formed on a single cell. Thus, the number of cells is reduced, and consequently, the amount of time required for determining the electromagnetic-field strength is reduced. In the present embodiment, the size in the directions perpendicular to the center axis of the rectangular columnar domain is adjusted so as to be larger than the size of a rectangle inscribed in a circle, which is the shape of the cross section perpendicular to the center axis of the side surface of the via, and so as to be smaller than a rectangle circumscribed around the circle. With this arrangement, even when the circular columnar or circular tubular via is approximated to the rectangular columnar model, numeric values of impedance and so on may be accurately calculated.

During analysis of radiation of electromagnetic waves due to plane resonance between a power layer and a ground layer, the influence of the intrinsic impedance of the via may increase. According to the present embodiment, however, an electric-field strength of 0 is given, as a fixed value, to the edges of cells located in the vicinity of the center axis of the via. Thus, it is possible to significantly reduce the number of cells.

Modifications

The above-described embodiment is directed to a personal computer into which the FDTD simulator 13 is incorporated. That is, the above-described embodiment also encompasses hardware elements and software elements. The embodiments of the present invention, however, may also be directed to a simulation apparatus including only hardware elements.

Figure 24:
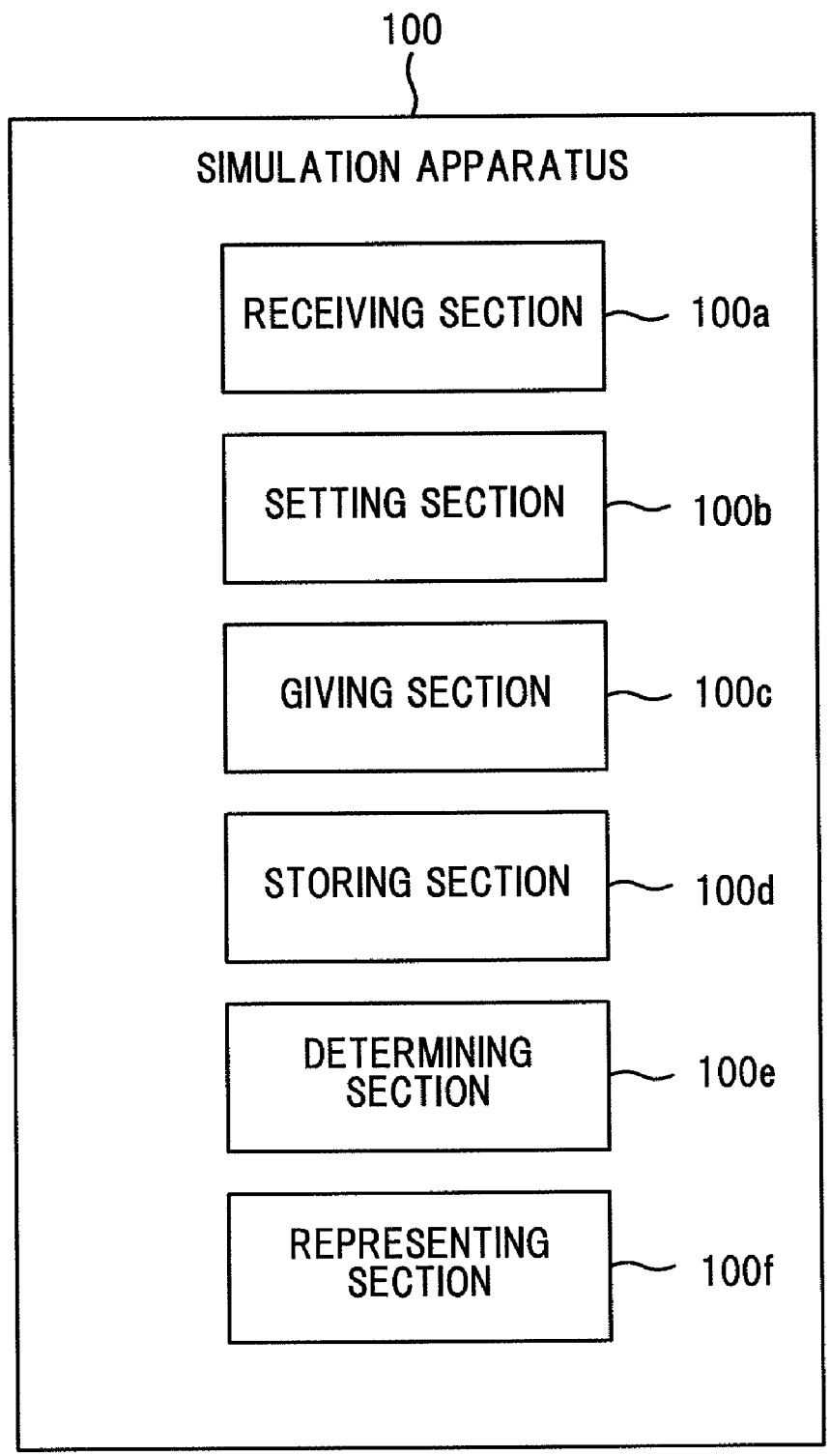
FIG. 24 is a diagram illustrating the configuration of a simulation apparatus according to a modification.
Figure 25B:
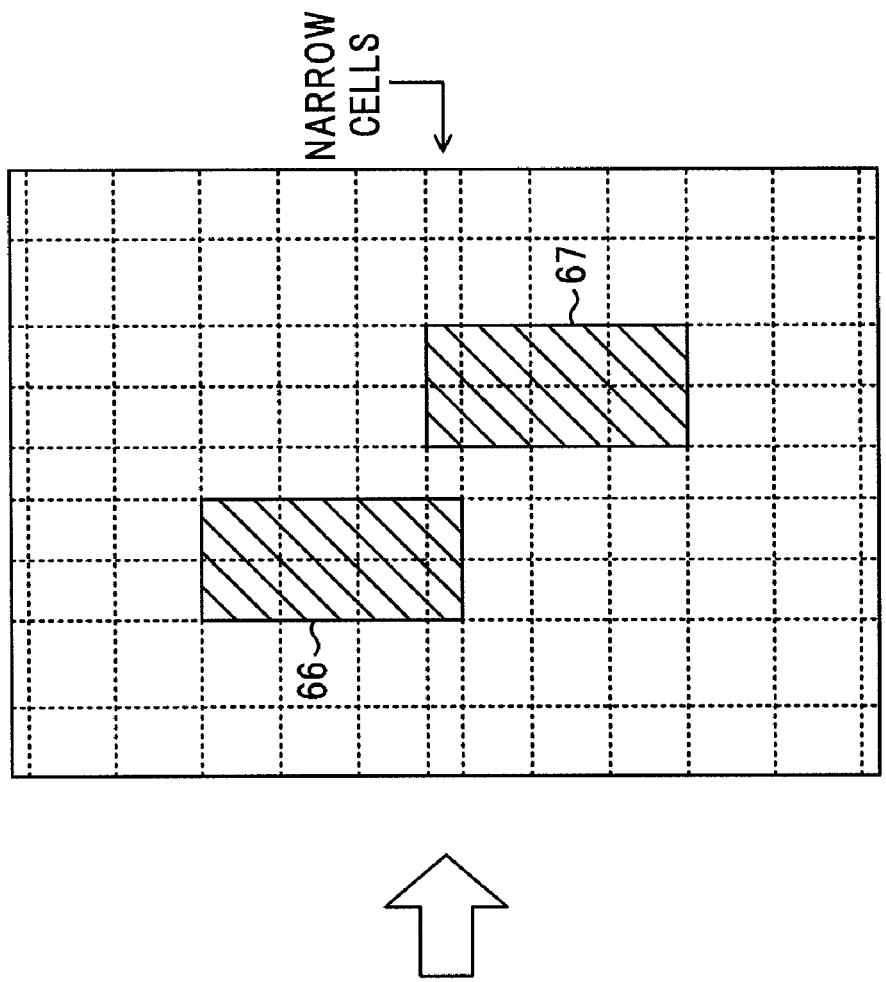
FIG. 25B illustrates one example of cells set by an existing FDTD simulator with respect to the circuit pattern illustrated in FIG. 25A.
Figure 25A:
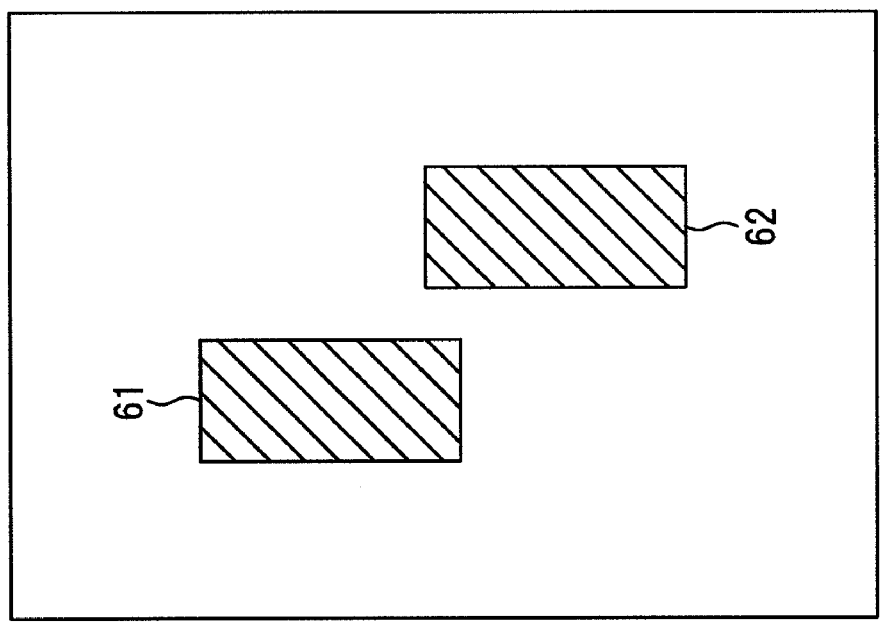
FIG. 25A illustrates one example of a circuit pattern.

FIG. 24 is a diagram illustrating the configuration of a simulation apparatus 100 according to a modification.

The simulation apparatus 100 according to this modification includes a receiving section 100a, a setting section 100b, a giving section 100c, a storing section 100d, a determining section 100e, and a representing section 100f. The receiving section 100a is hardware for performing processing that is equivalent to step S101 in FIG. 3. The setting section 100b is hardware for performing processing that is equivalent to steps S201 to S203 in FIG. 4. The giving section 100c is hardware for performing processing that is equivalent to steps S205 and S206 in FIG. 4. The storing section 100d is hardware for performing processing that is equivalent to steps S207 to S209 in FIG. 4. The determining section 100e is hardware for performing processing that is equivalent to steps S104 to S106 in FIG. 3. The representing section 100f is hardware for performing processing that is equivalent to step S107 in FIG. 3.

The sections 100a to 100f included in the simulation apparatus 100 according to the modification include, for example, an FPGA (field programmable gate array), an ASIC (application specific integrated circuit), an LSI (large scale integration), an IC (integrated circuit), a gate array, a logic gate, a signal processing circuit, and an analog circuit. Examples of the logic gate include an AND gate, an OR gate, a NOT gate, a NAND gate, a NOR gate, a flip-flop, and a counter circuit. The signal processing circuit may include a circuit element for executing, for example, addition, multiplication, division, inversion, product-sum operation, differentiation, and integration on a signal value, and the like. The analog circuit may include a circuit element for executing, for example, amplification, addition, multiplication, differentiation, and integration on a signal value, and the like.

In this modification, when multiple cells are to be set in a virtual space in which the shape of a multilayer printed circuit board is defined, the nodes of the cells are also arranged at regular intervals in the plane parallel to the printed circuit board. Thus, no narrow cells are generated in the plane parallel to the printed circuit board. This arrangement may also eliminate the need for processing for detecting edges of circuit wires. This also reduces the amount of time required for discretization of virtual space in which the shape of a printed circuit board is defined and for determination of the electromagnetic field strengths.

According to the modification, when multiple cells are to be set in a virtual space in which the shape of a multilayer printed circuit board is defined, the boundary between a conductive layer and a dielectric layer is precisely traced by edges of the cells and the width of the conductive layer is accurately modeled. Thus, according to the modification, errors in numeric values of impedance and so on do not increase.

In the above-described embodiment, when multiple cells are to be set in a specific virtual space, the computer arranges the nodes of the cells at regular intervals in the plane parallel to the printed circuit board. Thus, the electromagnetic field simulator does not generate narrow cells in the plane parallel to the printed circuit board. This arrangement may also reduce if not eliminate the need for processing for detecting edges of circuit wires.

Thus, according to the above-described embodiment, it is possible to reduce the amount of time required for discretization of virtual space in which the shape of a printed circuit board is defined and for determination of the electromagnetic field strengths.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention has been described in detail, it should be understood that the various changes, substitutions, and alterations could be made hereto without departing from the spirit and scope of the invention.

What is claimed is:

1. A non-transitory computer readable medium storing an electromagnetic field simulation program that causes a computer to execute:
   a receiving process of receiving data defining, in virtual space, a shape of a conductor and a shape of an insulator included in a conductive layer and a dielectric layer respectively of a printed circuit board;
   a setting process of setting a plurality of cells in the virtual space
      by arranging first nodes of the cells on a boundary between the conductive layer and the dielectric layer in a thickness direction of the printed circuit board,
      by arranging the first nodes of the cells at regular intervals in a dorn in selected in a plane parallel to the printed circuit board, and
      by arranging second nodes of the cells outside the domain in the lane and outside the printed circuit in the thickness direction so that spacing of the second nodes geometrically increases in the plane and in the thickness direction towards absorbing boundaries for determination of an electromagnetic field strength;
   a giving process of giving, to each of the cells, an electric constant of a medium occupying an area of each of the cells; and
   a determining process of determining a change over time in the electromagnetic field strength in each of the cells.

2. The non-transitory computer readable medium storing the electromagnetic field simulation program according to claim 1, wherein in the determining process, the change over time in the electromagnetic field strength is determined based on a finite-difference time-domain.

3. The non-transitory computer readable medium storing the electromagnetic field simulation program according to claim 1, wherein a spacing of the first nodes in the plane parallel to the printed circuit board is set to a value in a range that does not exceed a specific value corresponding to a narrowest wire width in a circuit pattern formed at the conductor included in the conductive layer in the printed circuit board.

4. The non-transitory computer readable medium storing the electromagnetic field simulation program according to claim 3, wherein the specific value is five-sixths of the narrowest wire width.

5. The non-transitory computer readable medium storing the electromagnetic field simulation program according to claim 3, wherein the spacing of the first nodes is set so as to reduce a number of the cells.

6. The non-transitory computer readable medium storing the electromagnetic field simulation program according to claim 1, wherein the dielectric layer in the printed circuit board includes a circular columnar via or a circular tubular via, and in the giving process, a rectangular columnar domain that has substantially the same height as the via and that includes a part of the via is specified and the electric constant of the medium of the via is given to all cells included in the specified rectangular columnar domain.

7. The non-transitory computer readable medium storing the electromagnetic field simulation program according to claim 6, wherein in the giving process, a cross section shape perpendicular to a center axis of the rectangular columnar domain is larger than a rectangle inscribed in a circle that is a cross section shape perpendicular to a center axis of a side surface of the via, and is smaller than a rectangle circumscribed around the circle.

8. The non-transitory computer readable medium storing the electromagnetic field simulation program according to claim 6, wherein the dielectric layer in the printed circuit board includes a circular columnar via or a circular tubular via, and in the giving process, an insulator electric constant is given to cells whose areas are occupied by the medium of the via, and an electric field strength of zero is given, as a fixed value, to edges of the cells present in a vicinity of a center axis of the via.

9. An electromagnetic field simulation apparatus comprising:
   a processor; and
   a memory that stores a plurality of instructions, which are executed by the processor and cause the processor to:
   receive data defining, in virtual space, a shape of a conductor and a shape of an insulator included in a conductive layer and a dielectric layer of a printed circuit board
   set a plurality of cells in the virtual space by arranging first nodes of the cells on a boundary between the conductive layer and the dielectric layer in a thickness direction of the printed circuit board, arranging the first nodes of the cells at regular intervals in a domain selected in a plane parallel to the printed circuit board, and arranging second nodes of the cells outside the domain in the plane and outside the printed circuit in the thickness direction so that spacing of the second nodes geometrically increases in the plane and in the thickness direction toward absorbing boundaries for determination of an electromagnetic field strength,
   give, to each of the cells, an electric constant of a medium occupying an area of each of the cells, and
   determine a change over time in the electromagnetic field strength in each of the cells.

10. An electromagnetic field simulation method executable by a computer, the method comprising:
   receiving, at the computer, data defining, in virtual space, a shape of a conductor and a shape of an insulator included in a conductive layer and a dielectric layer of a printed circuit board;
   setting cells in the virtual space by arranging first nodes of the cells on a boundary between the conductive layer and the dielectric layer in a thickness direction of the printed circuit board, arranging the first nodes of the cells at regular intervals in a domain selected in a plane parallel to the printed circuit board, and arranging second nodes of the cells outside the domain in the plane and outside the printed circuit in the thickness direction so that spacing of the second nodes geometrically increases in the plane and in the thickness direction toward absorbing boundaries for determination of an electromagnetic field strength;
   giving, to each of the cells, an electric constant of a medium occupying an area of the each cell; and
   determining a change over time in the electromagnetic field strength in each of the cells.

* * * * *